US012751087B2

(12) United States Patent
Jung et al.

(10) Patent No.: US 12,751,087 B2
(45) Date of Patent: Sep. 29, 2026

(54) DISPLAY DEVICE

(71) Applicant: SAMSUNG DISPLAY CO., LTD., Yongin-si (KR)

(72) Inventors: Changsub Jung, Yongin-si (KR); Sangwon Yeo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 408 days.

(21) Appl. No.: 18/380,698

(22) Filed: Oct. 17, 2023

(65) Prior Publication Data

US 2024/0258338 A1 Aug. 1, 2024

(30) Foreign Application Priority Data

Jan. 31, 2023 (KR) ........................ 10-2023-0012993

(51) Int. Cl.

| | |
|---|---|
| ***H10D 86/60*** | (2025.01) |
| ***G09G 3/00*** | (2006.01) |
| ***H10D 86/40*** | (2025.01) |

(52) U.S. Cl.

CPC ............. *H10D 86/60* (2025.01); *G09G 3/006* (2013.01); *H10D 86/443* (2025.01); *G09G 2330/12* (2013.01)

(58) Field of Classification Search

CPC ...... G09G 3/006; G09G 2330/12; G09F 9/30; G01R 31/2844; G01R 31/2853; G01R 31/2825; H10K 59/131; H10K 59/82; H10H 29/142; H10D 86/60; H10D 86/443; H10D 86/40

See application file for complete search history.

(56) References Cited

U.S. PATENT DOCUMENTS

| | | | |
|---|---|---|---|
| 9,460,646 | B2 | 10/2016 | Hwang et al. |
| 10,546,909 | B2 | 1/2020 | Lee et al. |
| 2011/0169792 | A1 | 7/2011 | Shimizu et al. |
| 2018/0286939 | A1 | 10/2018 | Lee et al. |

(Continued)

FOREIGN PATENT DOCUMENTS

| | | | |
|---|---|---|---|
| JP | 2009-047877 | A2 | 3/2009 |
| KR | 10-1971066 | B1 | 4/2019 |

(Continued)

OTHER PUBLICATIONS

International Search Report dated Apr. 25, 2024 from the World Intellectual Property Office (WIPO) for International Application No. PCT/KR2024/001298.

(Continued)

*Primary Examiner* — Wasiul Haider

(74) *Attorney, Agent, or Firm* — F. CHAU & ASSOCIATES, LLC

(57) ABSTRACT

A display device including: a first test pad disposed on a substrate; a detection pad disposed on the substrate; a first voltage pad disposed on the substrate and electrically connected to the first test pad; a ground pad disposed on the substrate and electrically connected to the detection pad through a first contact point of the detection pad; and a second voltage pad disposed on the substrate and electrically connected to the detection pad through a second contact point of the detection pad, wherein the second contact point is opposite to the first contact point in a first direction.

20 Claims, 20 Drawing Sheets

(56) References Cited

U.S. PATENT DOCUMENTS

| | | | | |
|---|---|---|---|---|
| 2020/0212356 | A1* | 7/2020 | Kim | H10K 59/122 |
| 2021/0091162 | A1 | 3/2021 | Kim et al. | |
| 2021/0181889 | A1* | 6/2021 | Kim | G06F 3/0416 |
| 2022/0085261 | A1 | 3/2022 | Min et al. | |

FOREIGN PATENT DOCUMENTS

| | | | |
|---|---|---|---|
| KR | 10-2028978 | B1 | 10/2019 |
| KR | 10-2022-0034986 | | 3/2022 |
| KR | 10-2022-0056692 | | 5/2022 |
| KR | 10-2022-0066009 | A | 5/2022 |
| KR | 10-2396181 | | 5/2022 |

OTHER PUBLICATIONS

Extended European search report dated Jun. 21, 2024 from the European Patent Office for corresponding European Patent Application No. 24153367.8.

* cited by examiner

DISPLAY DEVICE

This application claims priority under 35 U.S.C. § 119 to Korean Patent Application No. 10-2023-0012993, filed on Jan. 31, 2023, the disclosure of which is incorporated by reference herein in its entirety.

TECHNICAL FIELD

Embodiments of the inventive concept relate to a display device.

DISCUSSION OF RELATED ART

A display device includes pixels and an integrated circuit that transmits signals and voltages to the pixels. The pixels, in turn, generate driving current to emit light. The integrated circuit may be mounted on the display device using either a chip-on-plastic (COP) method or a chip-on-glass (COG) method.

To ensure proper electrical connectivity of the integrated circuit, the display device incorporates test pads and detection pads. By measuring the connection resistance through a test pad and a detection pad, the integrated circuit's electrical connections can be tested. Additionally, there is a focus on reducing resistance noise between a substrate and the integrated circuit.

SUMMARY

Embodiments of the inventive concept provide a display device.

A display device according to an embodiment of the inventive concept may include a display device including: a first test pad disposed on a substrate; a detection pad disposed on the substrate; a first voltage pad disposed on the substrate and electrically connected to the first test pad; a ground pad disposed on the substrate and electrically connected to the detection pad through a first contact point of the detection pad; and a second voltage pad disposed on the substrate and electrically connected to the detection pad through a second contact point of the detection pad, wherein the second contact point is opposite to the first contact point in a first direction.

The detection pad includes a first surface facing the first test pad and a second surface opposite to the first surface in the first direction, the first contact point is at the second surface; and the second contact point is at the first surface.

The display device further including: a second test pad disposed between the first test pad and the detection pad; and a current pad electrically connected to the second test pad.

The first test pad includes a second surface facing the second test pad and a first surface opposite to the second surface, and the first voltage pad is electrically connected to the first test pad at the first surface of the first test pad.

The second test pad includes a second surface facing the detection pad and a first surface opposite to the second surface, and the current pad is electrically connected to the second test pad at the first surface of the second test pad.

The display device further including a dummy pad electrically connected to the first test pad.

The display device further including: an integrated circuit disposed on the first test pad and the detection pad; and an adhesive film adhering the integrated circuit to the substrate.

The integrated circuit is arranged in a chip-on-plastic (COP) method or a chip-on-glass (COG) method.

The adhesive film includes conductive balls, and the conductive balls electrically connect the first test pad to the integrated circuit and the detection pad to the integrated circuit.

The display device further including a printed circuit board disposed on the first voltage pad, the ground pad, and the second voltage pad.

The detection pad includes a first surface facing the first test pad and a second surface opposite to the first surface in the first direction, the first contact point is at the first surface, and the second contact point is at the second surface.

The display device further including: a second test pad disposed between the first test pad and the detection pad; and a current pad electrically connected to the second test pad.

The display device further including: a first dummy pad electrically connected to the first test pad; and a second dummy pad electrically connected to the second test pad.

The display device further including: a second test pad adjacent to a second direction perpendicular to the first direction; and a current pad electrically connected to the second test pad.

The detection pad includes a first surface facing the first test pad and a second surface opposite to the first surface in the first direction, the first contact point is at the second surface, and the second contact point is at the first surface.

The detection pad includes a first surface facing the first test pad and a second surface opposite to the first surface in the first direction, the first contact point is at the first surface, and the second contact point is at the second surface.

The display device further including: a second test pad disposed between the first test pad and the detection pad; a third test pad adjacent to the first test pad; and a dummy pad electrically connected to the third test pad.

The detection pad includes a first surface facing the first test pad and a second surface opposite to the first surface in the first direction, the first contact point is at the second surface, and the second contact point is at the first surface.

The detection pad includes a first surface facing the first test pad and a second surface opposite to the first surface in the first direction, the first contact point is at the first surface, and the second contact point is at the second surface.

A display device according to an embodiment of the inventive concept may include a display device including: a first pad area including a first test pad, a second test pad and a detection pad arranged in a line in a first direction; and a second pad area adjacent to the first pad area, the second pad area including a ground pad, a current pad, a first voltage pad and a second voltage pad arranged in a line in a second direction intersecting the first direction, wherein the current pad is connected to the second test pad, the first voltage pad is connected to the first test pad, the ground pad is connected to a first connection point of the detection pad and the second voltage pad is connected to a second connection point of the detection pad.

Therefore, a display device according to embodiments of the inventive concept may include a display panel and an integrated circuit. The integrated circuit may be electrically connected to the display panel in a COP method or a COG method. A detection pad for testing a connection resistance of the integrated circuit may be provided in the display device, and a ground voltage and a test voltage may be applied to the detection pad.

In this case, the detection pad may be connected to a ground pad at a first contact point, may be connected to a voltage pad at a second contact point, and the first contact point and the second contact point may be opposite to each other in a first direction. Since a test current flows to the first contact point to which the ground voltage is applied, the test current may not flow to the second contact point. Accordingly, since only the resistance of the adhesive film connecting the detection pad and the integrated circuit is measured, resistance noise can be reduced. Therefore, regardless of the degree of alignment of the integrated circuit in the first direction, the connection resistance of the integrated circuit can be accurately measured.

BRIEF DESCRIPTION OF THE DRAWINGS

The accompanying drawings, which are included to provide a further understanding of the inventive concept, illustrate embodiments of the inventive concept together with the description.

DETAILED DESCRIPTION OF THE EMBODIMENTS

Illustrative, non-limiting embodiments of the inventive concept will be more clearly understood from the following detailed description in conjunction with the accompanying drawings.

Figure 1:
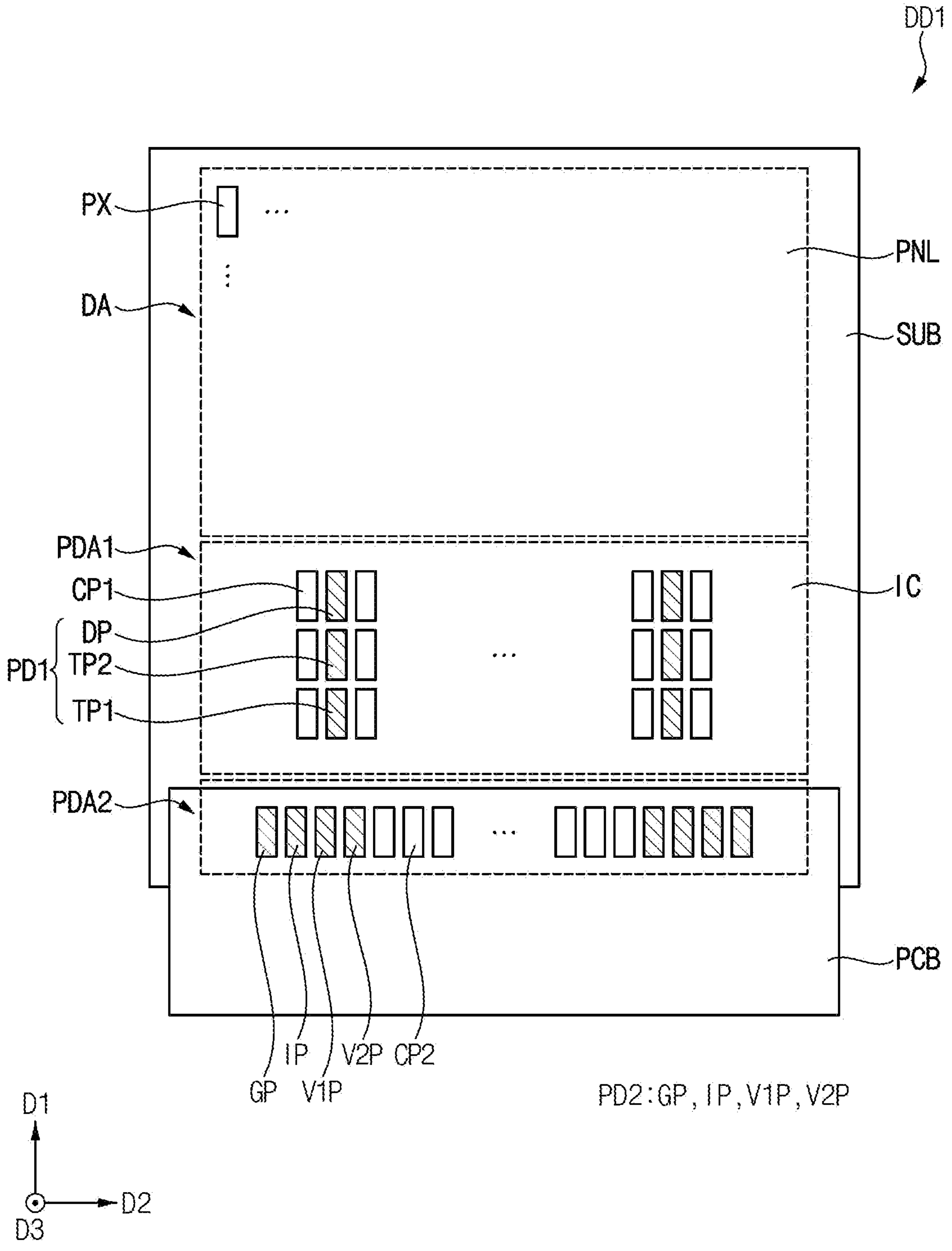
FIG. 1 is a plan view illustrating a display device according to an embodiment of the inventive concept.
Figure 2:
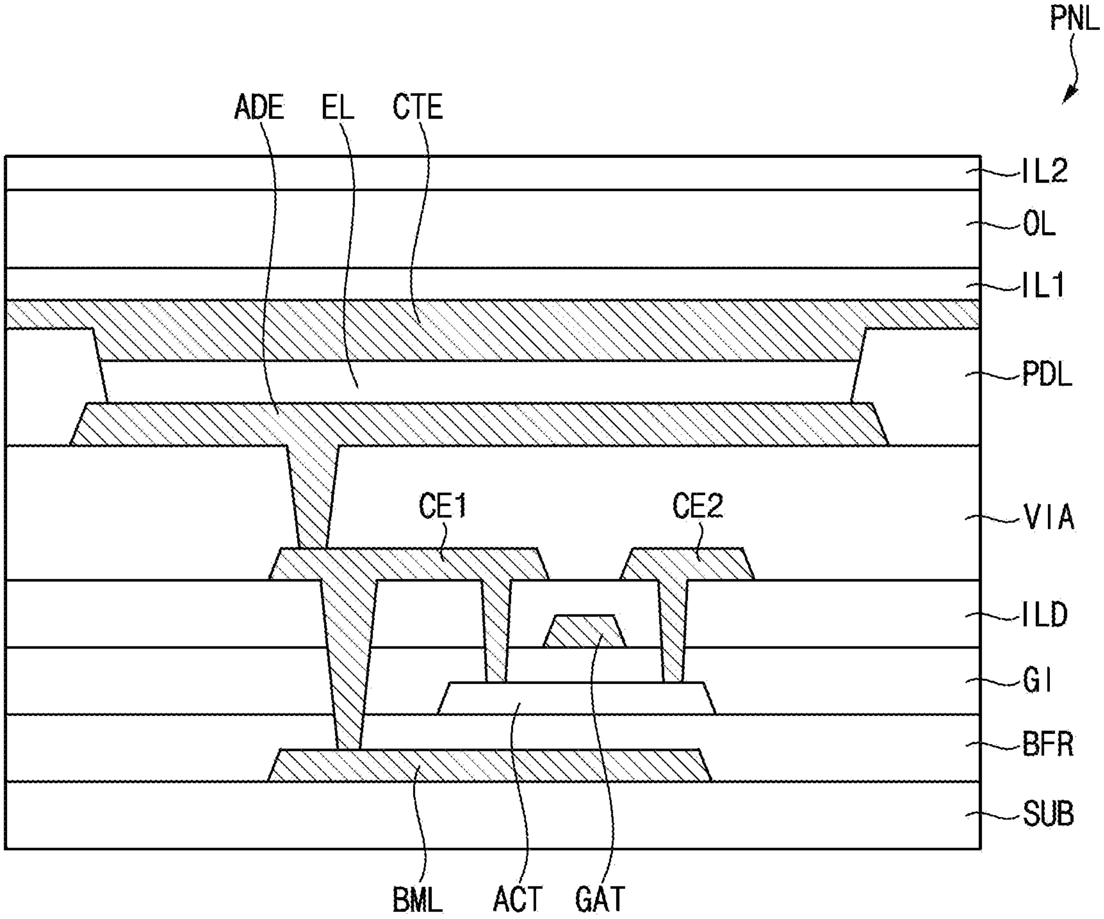
FIG. 2 is a cross-sectional view illustrating a display panel included in the display device of FIG. 1.
Figure 3:
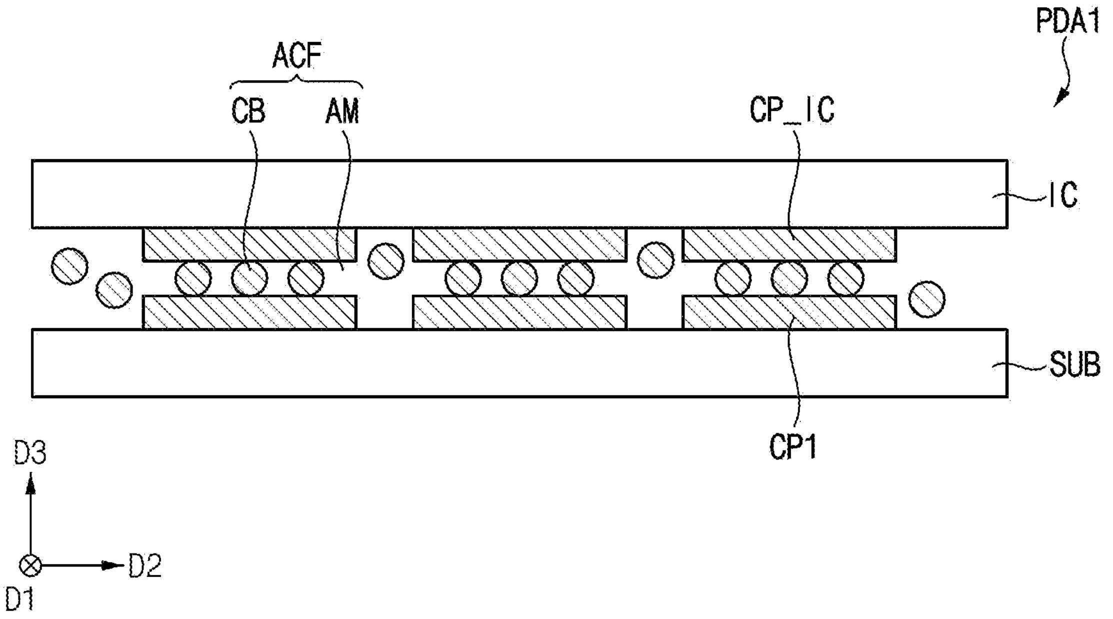
FIG. 3 is a cross-sectional view illustrating a first pad area included in the display device of FIG. 1.

FIG. 1 is a plan view illustrating a display device according to an embodiment of the inventive concept. FIG. 2 is a cross-sectional view illustrating a display panel included in the display device of FIG. 1. FIG. 3 is a cross-sectional view illustrating a first pad area included in the display device of FIG. 1.

Referring to FIG. 1, a display device DD1 according to an embodiment of the inventive concept may be divided into a display area DA, a first pad area PDA1, and a second pad area PDA2. In an embodiment, the first pad area PDA1 may be adjacent to the second pad area PDA2 in a first direction D1, and the display area DA may be adjacent to the first pad area PDA1 in the first direction D1. As an example, the first pad area PDA1 may be disposed between the display area DA and the second pad area PDA2.

A display panel PNL may be disposed in the display area DA, and the display panel PNL may include at least one pixel PX. The pixel PX may generate a driving current and may emit light corresponding to the driving current. In other words, each pixel PX may generate a driving current and subsequently emit light corresponding to this driving current. The driving current may be generated by signals and voltages provided from the first and second pad areas PDA1 and PDA2.

The first pad area PDA1 may be an area where an integrated circuit IC and the display panel PNL are electrically connected to each other.

In an embodiment, a first connection pad CP1, a detection pad DP, a first test pad TP1, a second test pad TP2, and the integrated circuit IC may be disposed in the first pad area PDA1.

For example, the first connection pad CP1, the detection pad DP, the first test pad TP1, and the second test pad TP2 may be disposed on a substrate SUB, and the integrated circuit IC may be disposed on the first connection pad CP1, the detection pad DP, the first test pad TP1, and the second test pad TP2. In other words, the integrated circuit IC may overlap the first connection pad CP1, the detection pad DP, the first test pad TP1, and the second test pad TP2.

In an embodiment, the integrated circuit IC may be disposed in a COP (chip on plastic) method or a COG (chip on glass) method.

In an embodiment, the integrated circuit IC may be a data driver integrated circuit for providing a data voltage to the pixel PX, a gate driver integrated circuit for providing a gate signal to the pixel PX, a combined integrated circuit that includes a data driver and a gate driver, and so forth. In addition, the integrated circuit IC may be implemented as a single component or implemented as a plurality of components.

The first connection pad CP1 may be electrically connected to the integrated circuit IC and the pixel PX. Accordingly, the first connection pad CP1 may transfer signals and voltages from the integrated circuit IC to the pixel PX.

The detection pad DP, the first test pad TP1, and the second test pad TP2 may be electrically connected to the integrated circuit IC.

For example, the first connection pad CP1, the detection pad DP, the first test pad TP1, and the second test pad TP2 may be connected to the integrated circuit IC in the same manner. Accordingly, the detection pad DP, the first test pad TP1, and the second test pad TP2 may be pads for testing whether the first connection pad CP1 is properly connected to the integrated circuit IC. For example, the detection pad DP, the first test pad TP1, and the second test pad TP2 may serve as test points.

In an embodiment, as shown in FIG. 1, pads may be arranged in three rows in the first pad area PDA1. However, the inventive concept is not limited thereto, and two or four or more rows of pads may be disposed in the first pad area PDA1.

The second pad area PDA2 may be an area where a printed circuit board PCB and the integrated circuit IC (or the display panel PNL) are connected to each other.

In an embodiment, a ground pad GP, a current pad IP, a first voltage pad V1P, a second voltage pad V2P, a second connection pad CP2, and the printed circuit board PCB may be disposed in the second pad area PDA2.

For example, the ground pad GP, the current pad IP, the first voltage pad V1P, the second voltage pad V2P, and the second connection pad CP2 may be disposed on the substrate SUB, and the printed circuit board PCB may be disposed on the ground pad GP, the current pad IP, the first voltage pad V1P, the second voltage pad V2P, and the second connection pad CP2. In other words, the printed circuit board PCB may overlap the ground pad GP, the current pad IP, the first voltage pad V1P, the second voltage pad V2P, and the second connection pad CP2.

In an embodiment, the printed circuit board PCB may be electrically connected to an external device.

The second connection pad CP2 may be electrically connected to the printed circuit board PCB and the first connection pad CP1. Accordingly, the second connection pad CP2 may transfer signals and voltages from the printed circuit board PCB to the first connection pad CP1.

The ground pad GP, the current pad IP, the first voltage pad V1P, and the second voltage pad V2P may be electrically connected to the first test pad TP1, the second test pad TP2, and the detection pad DP. The ground pad GP, the current pad IP, the first voltage pad V1P, and the second voltage pad V2P may be pads for testing whether the first connection pad CP1 is properly connected to the integrated circuit IC. In other words, the ground pad GP, the current pad IP, the first voltage pad V1P, and the second voltage pad V2P may serve as test points.

Referring to FIG. 2, the display panel PNL may include a substrate SUB, a lower metal pattern BML, a buffer layer BFR, an active pattern ACT, a gate insulating layer GI, gate electrodes GAT, an interlayer insulating layer ILD, first and second connection electrodes CE1 and CE2, a via layer VIA, a pixel electrode ADE, a pixel defining layer PDL, an emission layer EL, a common electrode CTE, a first inorganic layer IL1, an organic layer OL, and a second inorganic layer IL2.

The substrate SUB may include a transparent or opaque material. In an embodiment, examples of materials that can be used as the substrate SUB may be glass, quartz, plastic, and the like. These may be used alone or in combination with each other. In addition, the substrate SUB may be composed of a single layer or multiple layers in combination with each other.

The lower metal pattern BML may be disposed on the substrate SUB. In an embodiment, the lower metal pattern BML may be formed of a metal, an alloy, a conductive metal oxide, a transparent conductive material, or the like. Examples of materials that can be used as the lower metal pattern BML may be silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other. In addition, the lower metal pattern BML may be formed as a single layer or as multiple layers in combination with each other.

The buffer layer BFR may be disposed on the substrate SUB and may cover the lower metal pattern BML. In an embodiment, the buffer layer BFR may be formed of an inorganic insulating material. Examples of materials that can be used as the inorganic insulating material may be silicon oxide, silicon nitride, and silicon oxynitride. These may be used alone or in combination with each other. The buffer layer BFR may prevent diffusion of metal atoms or atoms or impurities from the substrate SUB into the active pattern ACT. In addition, the buffer layer BFR may control a heat supply rate during a crystallization process for forming the active pattern ACT.

The active pattern ACT may be disposed on the buffer layer BFR. In an embodiment, the active pattern ACT may be formed of a silicon semiconductor material or an oxide semiconductor material. Examples of the silicon semiconductor material that can be used for the active pattern ACT may be amorphous silicon and polycrystalline silicon. Examples of the oxide semiconductor material that can be used for the active pattern ACT may be InGaZnO (IGZO) and InSnZnO (ITZO). In addition, the oxide semiconductor material may further include indium (In), gallium (Ga), tin (Sn), zirconium (Zr), vanadium (V), hafnium (Hf), cadmium (Cd), germanium (Ge), chromium (Cr)), titanium (Ti), and zinc (Zn). These may be used alone or in combination with each other.

The gate insulating layer GI may cover the active pattern ACT and may be disposed on the buffer layer BFR. In an embodiment, the gate insulating layer GI may be formed of an insulating material. Examples of an insulating material that can be used as the gate insulating layer GI may be silicon oxide, silicon nitride, and silicon oxynitride. These may be used alone or in combination with each other.

The gate electrode GAT may be disposed on the gate insulating layer GI. In an embodiment, the gate electrode GAT may be formed of metal, an alloy, a conductive metal oxide, a transparent conductive material, or the like. Examples of materials that can be used for the gate electrode GAT may be silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other.

The interlayer insulating layer ILD may be disposed on the buffer layer BFR. The interlayer insulating layer ILD may cover the gate electrode GAT. In an embodiment, the interlayer insulating layer ILD may be formed of an insulating material. Examples of insulating materials that can be used as the interlayer insulating layer ILD may be silicon oxide, silicon nitride, and silicon oxynitride. These may be used alone or in combination with each other.

The first and second connection electrodes CE1 and CE2 may be disposed on the interlayer insulating layer ILD. In an embodiment, the first and second connection electrodes CE1 and CE2 may be formed of metal, an alloy, a conductive metal oxide, a transparent conductive material, or the like. Examples of materials that may be used as the first and second connection electrodes CE1 and CE2 may be silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other.

The first connection electrode CE1 may contact the lower metal pattern BML and the active pattern ACT, and the second connection electrode CE2 may contact the active pattern ACT.

The via layer VIA covers the first and second connection electrodes CE1 and CE2 and may be disposed on the interlayer insulating layer ILD. In an embodiment, the via layer VIA may be formed of an organic material. Examples of organic materials that can be used for the via layer VIA may be a photoresist, a polyacrylic resin, a polyimide resin, and an acrylic resin. These may be used alone or in combination with each other.

The pixel electrode ADE may be disposed on the via layer VIA. In an embodiment, the pixel electrode ADE may be formed of metal, an alloy, a conductive metal oxide, a transparent conductive material, or the like. Examples of materials that may be used as the pixel electrode ADE may be silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other.

The pixel defining layer PDL may be disposed on the pixel electrode ADE and may cover an end of the pixel electrode ADE. The pixel defining layer PDL may define an emission area. In an embodiment, the pixel defining layer PDL may be formed of an organic material. Examples of organic materials that can be used as the pixel defining layer PDL may be a photoresist, a polyacrylic resin, a polyimide resin, an acrylic resin, etc. These may be used alone or in combination with each other.

The emission layer EL may be disposed on the pixel electrode ADE. The common electrode CTE may be disposed on the emission layer EL.

The first inorganic layer IL1 may be disposed on the common electrode CTE. In an embodiment, the first inorganic layer IL1 may be formed of an inorganic material. Examples of inorganic materials that can be used as the first inorganic layer IL1 may be silicon oxide, silicon nitride, and silicon oxynitride. These may be used alone or in combination with each other.

The organic layer OL may be disposed on the first inorganic layer IL1. In an embodiment, the organic layer OL may be formed of an organic material. Examples of organic materials that can be used as the organic layer OL may be a photoresist, a polyacrylic resin, a polyimide resin, and an acrylic resin. These may be used alone or in combination with each other.

The second inorganic layer IL2 may be disposed on the organic layer OL. In an embodiment, the second inorganic layer IL2 may be formed of an inorganic material. Examples of inorganic materials that can be used as the second inorganic layer IL2 may be silicon oxide, silicon nitride, and silicon oxynitride. These may be used alone or in combination with each other.

Referring to FIG. 3, a first connection pad CP1 may be disposed on the substrate SUB, a circuit connection pad CP_IC may be disposed on the first connection pad CP1, and the integrated circuit (IC) may be disposed on the circuit connection pad CP_IC. The first connection pad CP1 may be formed on the substrate SUB, the circuit connection pad CP_IC may be formed on the integrated circuit IC, and the first connection pad CP1 and the circuit connection pad CP_IC may be adhered to each other by an adhesive film ACF.

The adhesive film ACF may be an anisotropic conductive film having conductivity and may include conductive balls CB and an adhesive member AM.

Each of the conductive balls CB may be a conductive particle. For example, the conductive balls CB may include conductive particles such as metal or metal oxide, and the metal may include nickel (Ni), iron (Fe), copper (Cu), aluminum (Al), tin (Sn), zinc (Zn), chromium (Cr), cobalt (Co), silver (Ag), and gold (Au), etc.

The adhesive member AM may include a polymer material, and for example, an epoxy resin or an acrylic resin may be used.

In the first pad area PDA1, lower pads and upper pads may be electrically connected through the conductive balls CB. For example, as shown in FIG. 3, the first connection pad CP1 and the circuit connection pad CP_IC may be electrically connected through the conductive balls CB. Here, the first connection pad CP1 may be a lower pad and the circuit connection pad CP_IC may be an upper pad.

Figure 4:
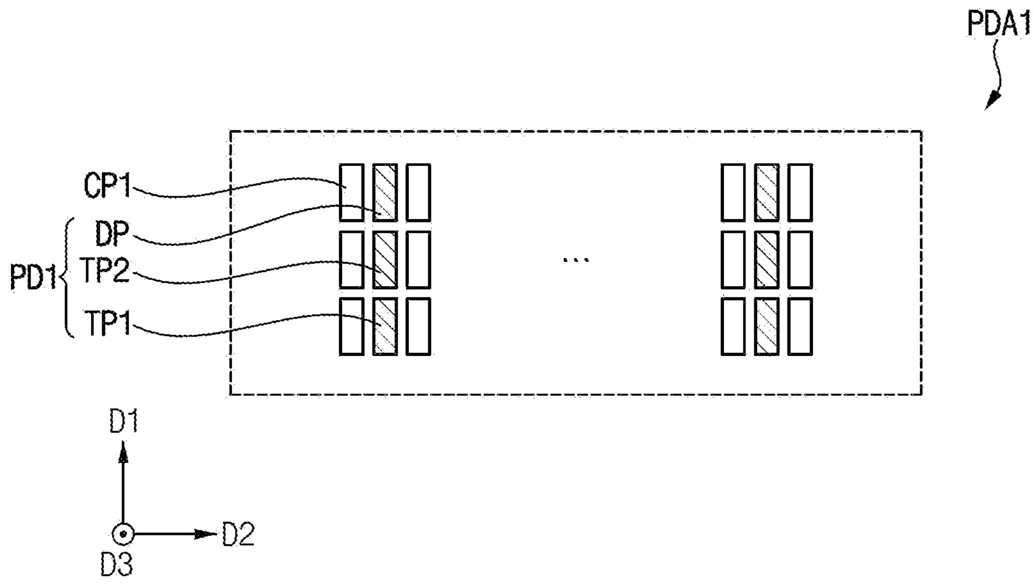
FIG. 4 is a plan view illustrating a first pad area included in the display device of FIG. 1.
Figure 5:
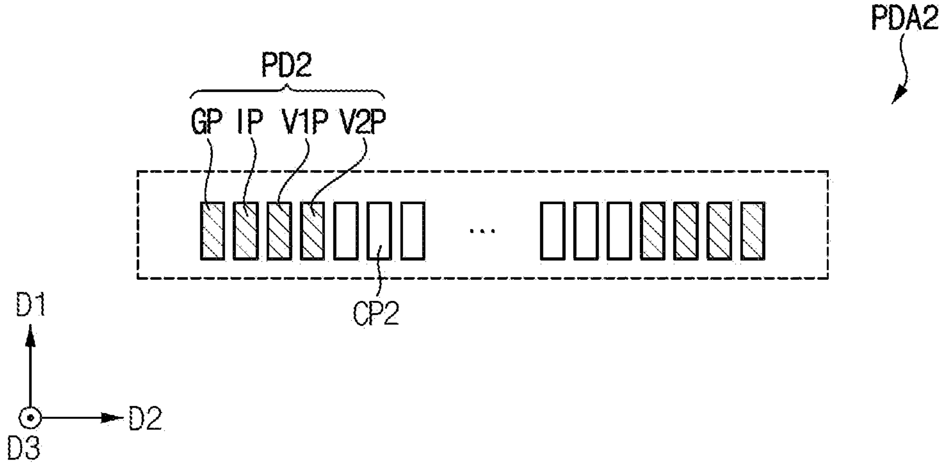
FIG. 5 is a plan view illustrating a second pad area included in the display device of FIG. 1.

FIG. 4 is a plan view illustrating a first pad area included in the display device of FIG. 1. FIG. 5 is a plan view illustrating a second pad area included in the display device of FIG. 1.

Referring to FIG. 4, the first test pad TP1, the second test pad TP2, the detection pad DP, and the first connection pad CP1 may be disposed in the first pad area PDA1.

In an embodiment, the second test pad TP2 may be adjacent to the first test pad TP1 in the first direction D1, and may be disposed between the first test pad TP1 and the detection pad DP. The detection pad DP may be adjacent to the second test pad TP2 in the first direction D1. The detection pad DP may be adjacent to the first connection pad CP1 in a second direction D2 perpendicular to the first direction D1. However, the inventive concept is not limited thereto, and the first test pad TP1, the second test pad TP2, the detection pad DP, and the first connection pad CP1 may be properly disposed as needed.

As described above, the first test pad TP1, the second test pad TP2, and the detection pad DP may be referred to as first pads PD1 for testing whether the first connection pad CP1 is properly connected to the integrated circuit IC.

Referring to FIG. 5, the ground pad GP, the current pad IP, the first voltage pad V1P, the second voltage pad V2P, and the second connection pad CP2 may be disposed in the second pad area PDA2.

In an embodiment, the current pad IP may be adjacent to the ground pad GP in the second direction D2, the first voltage pad V1P may be adjacent to the current pad IP in the second direction D2, and the second voltage pad V2P may be adjacent to the first voltage pad V1P in the second direction D2. Furthermore, the second voltage pad V2P may be adjacent to the second connection pad CP2 in the second direction D2. However, the inventive concept is not limited thereto, and the ground pad GP, the current pad IP, the first voltage pad V1P, the second voltage pad V2P, and the second connection pad CP2 may be appropriately arranged as needed.

As described above, the ground pad GP, the current pad IP, the first voltage pad V1P, and the second voltage pad V2P may be referred to as second pads PD2 for testing whether the first connection pad CP1 is properly connected to the integrated circuit IC.

Figure 6:
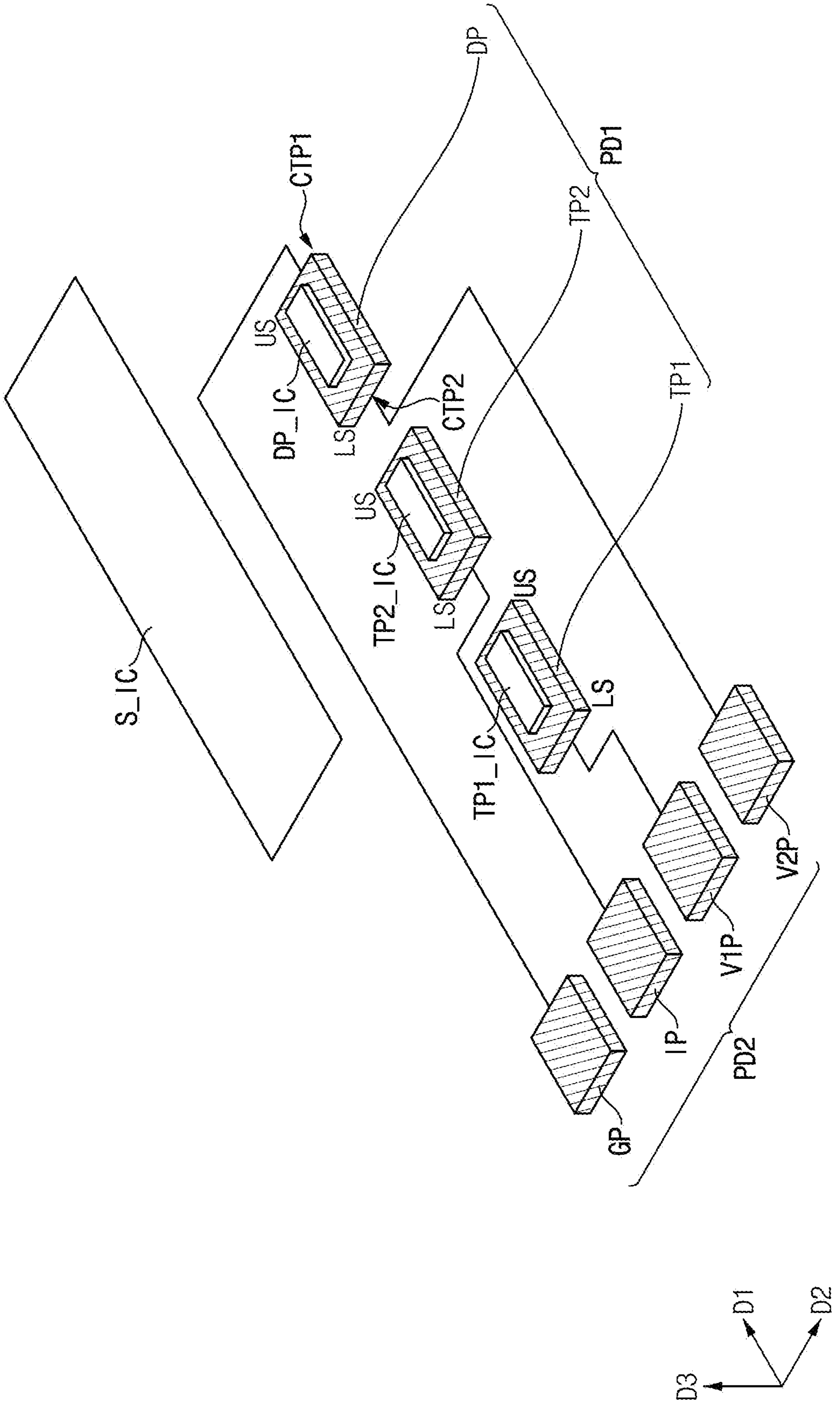
FIG. 6 is a perspective view illustrating first pads of FIG. 4 and second pads of FIG. 5.
Figure 7:
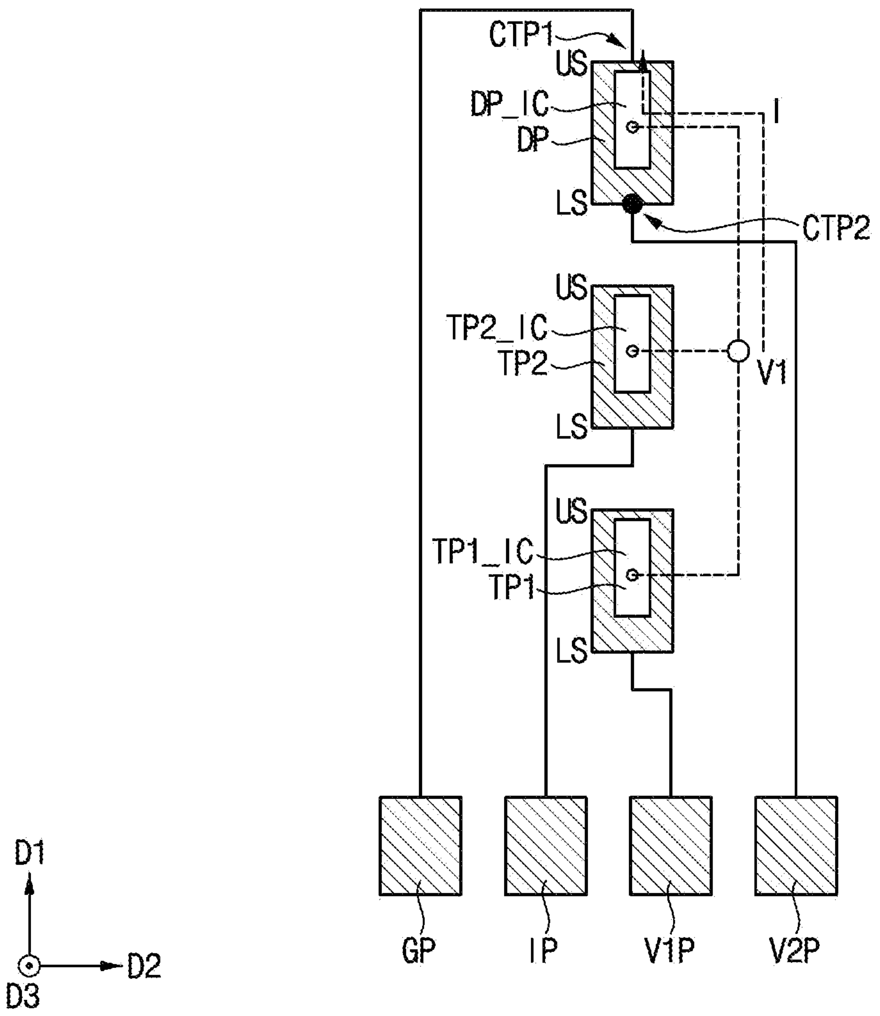
FIG. 7 is a plan view illustrating the first pads and the second pads of FIG. 6.

FIG. 6 is a perspective view illustrating first pads of FIG. 4 and second pads of FIG. 5. FIG. 7 is a plan view illustrating the first pads and the second pads of FIG. 6.

Referring to FIGS. 6 and 7, a first circuit test pad TP1_IC, a second circuit test pad TP2_IC, and a circuit detection pad DP_IC may be further formed on the integrated circuit IC together with the circuit connection pad CP_IC of FIG. 3. In addition, a short line S_IC may be formed inside the integrated circuit IC, and the short line S_IC may electrically connect the first circuit test pad TP1_IC, the second circuit test pad TP2_IC, and the circuit detection pad DP_IC.

The first circuit test pad TP1_IC may be disposed on the first test pad TP1 and may be electrically connected to the first test pad TP1 through the conductive balls CB.

The second circuit test pad TP2_IC may be disposed on the second test pad TP2 and may be electrically connected to the second test pad TP2 through the conductive balls CB.

The circuit detection pad DP_IC may be disposed on the detection pad DP and may be electrically connected to the detection pad DP through the conductive balls CB.

In an embodiment, the first voltage pad V1P may be electrically connected to the first test pad TP1. The first voltage pad V1P may apply a first voltage V1.

For example, the first test pad TP1 may include an upper surface US facing the second test pad TP2 and a lower surface LS opposite to the upper surface US, and the first voltage pad V1P may be electrically connected to the first test pad TP1 on the lower surface LS of the first test pad TP1. The lower surface LS of the first test pad TP1 may be closer to the first test pad TP1 than the upper surface US of the first test pad TP1.

In an embodiment, the current pad IP may be electrically connected to the second test pad TP2. The current pad IP may provide a test current I to the second test pad TP2.

For example, the second test pad TP2 may include an upper surface US facing the detection pad DP and a lower surface LS opposite to the upper surface US, and the current pad IP may be electrically connected to the second test pad TP2 on the lower surface LS of the second test pad TP2. The lower surface LS of the second test pad TP2 may be closer to the current pad IP and the upper surface US of the second test pad TP2.

In an embodiment, the second voltage pad V2P may be electrically connected to the detection pad DP. The second voltage pad V2P may apply a second voltage V2 to the detection pad DP.

In addition, in an embodiment, the ground pad GP may be electrically connected to the detection pad DP. The ground pad GP may apply a ground voltage G to the detection pad DP.

For example, the detection pad DP may include a lower surface LS facing the second test pad TP2 and an upper surface US opposite to the lower surface LS.

In an embodiment, the ground pad GP may be electrically connected to the detection pad DP through a first contact point CTP1 of the detection pad DP, and the second voltage pad V2P may be electrically connected to the detection pad DP through a second contact point CTP2 of the detection pad DP. In this case, the first contact point CTP1 may be opposite to the second contact point CTP2 in the first direction D1. For example, the first contact point CTP1 may be located on the upper surface US of the detection pad DP, and the second contact point CTP2 may be located on the lower surface LS of the detection pad DP.

Figure 8:
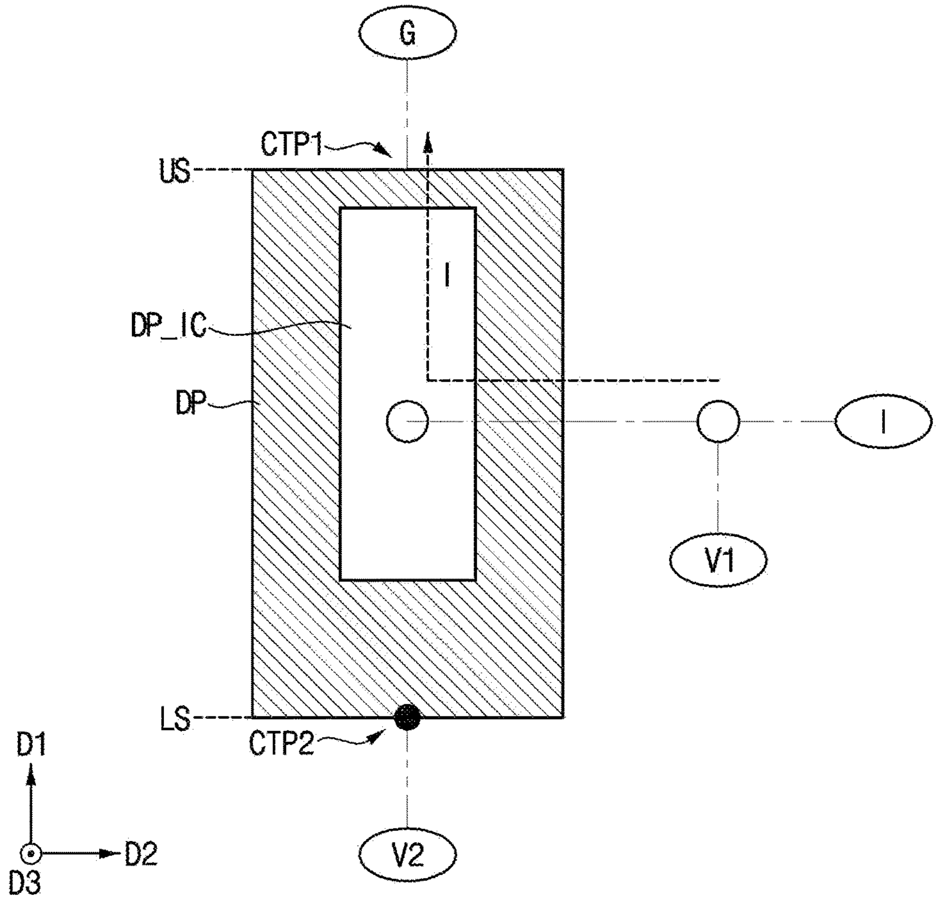
FIG. 8 is a plan view illustrating a detection pad included in the first pads of FIG. 6.
Figure 9:
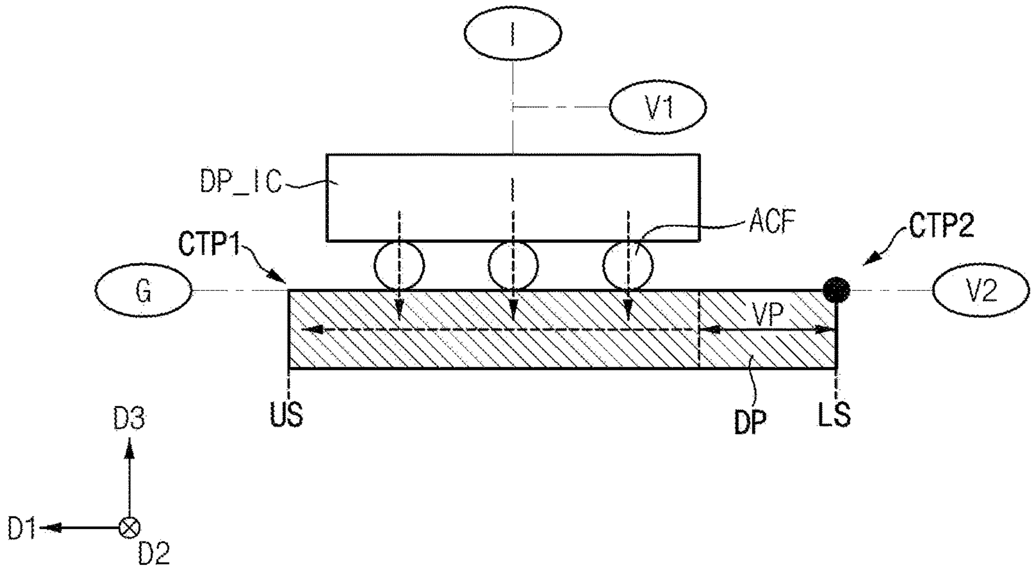
FIG. 9 is a cross-sectional view illustrating the detection pad of FIG. 8.
Figure 10:
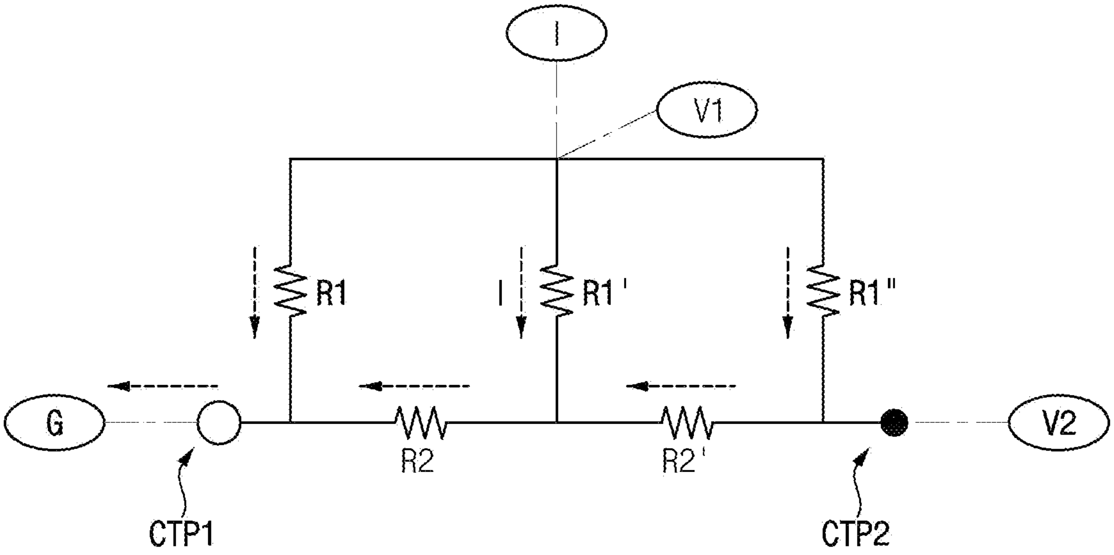
FIG. 10 is a circuit diagram illustrating an equivalent circuit of the detection pad of FIG. 9.
Figure 11:
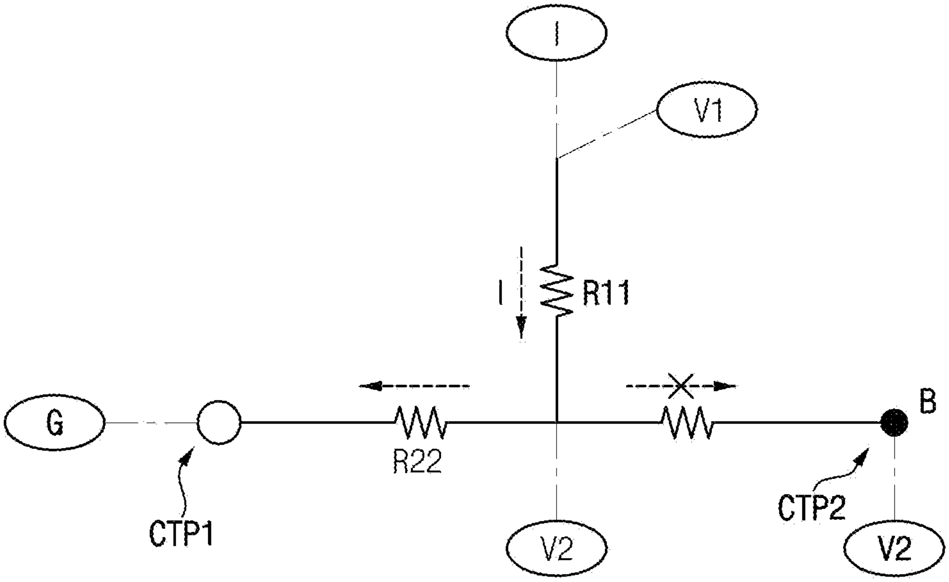
FIG. 11 is a circuit diagram illustrating a conversion circuit obtained by transforming the equivalent circuit of FIG. 10.

FIG. 8 is a plan view illustrating a detection pad included in the first pads of FIG. 6. FIG. 9 is a cross-sectional view illustrating the detection pad of FIG. 8. FIG. 10 is a circuit diagram illustrating an equivalent circuit of the detection pad of FIG. 9. FIG. 11 is a circuit diagram illustrating a conversion circuit obtained by transforming the equivalent circuit of FIG. 10. For example, the conversion circuit of FIG. 11 may be a circuit obtained by performing a Y–Δ transformation of the equivalent circuit of FIG. 10, calculating a parallel resistance, and then performing a Δ–Y transformation.

Referring to FIGS. 8 and 9, the test current I may flow from the circuit detection pad DP_IC, through the adhesive film ACF, and to the first contact point CTP1. In this case, since the first contact point CTP1 to which the ground voltage G is applied and the second contact point CTP2 to which the second voltage V2 is applied are opposite to each other, the test current I may flow to the first contact point CTP1, without flowing to a variable portion VP of the detection pad DP. By not flowing the variable portion VP of the detection pad DP, the test current I does not flow the second contact point CTP2.

In an embodiment, the variable portion VP may be a portion between the lower surface LS to which the second voltage V2 is applied and the circuit detection pad DP_IC. For example, the variable portion VP may not be overlapped b the circuit detection pad DP_IC in a third direction D3. Depending on a degree to which the circuit detection pads DP_IC are aligned in the first direction D1, a length of the variable portion VP may be changed, and accordingly, a resistance across the variable portion VP may be changed.

Since the detection pad DP of the inventive concept is connected to the ground pad GP and the second voltage pad V2P at the first contact point CTP1 and the second contact point CTP2, respectively, and the first contact point CTP1 and the second contact point CTP2 are opposite to each other in the first direction D1, the test current I may not flow to the variable portion VP. Accordingly, while measuring a connection resistance of the integrated circuit IC, the variable resistance of the variable portion VP may not be measured. In other words, the variable resistance of the variable portion VP may not be accounted for in the measurement of the connection resistance of the integrated circuit IC. Therefore, regardless of the degree to which the circuit detection pad DP_IC is aligned in the first direction D1, whether or not the circuit detection pad DP_IC is properly connected to the detection pad DP can be detected. In other words, the connection state of the circuit detection pad DP_IC to the detection pad DP can be determined regardless of the alignment of the circuit detection pad DP_IC in the first direction D1.

Referring to FIG. 10, the first voltage V1 may be greater than the second voltage V2. Accordingly, the test current I may flow from the circuit detection pad DP_IC, through the adhesive film ACF, and to the first contact point CTP1. While the test current I flows, resistances R1, R1', and R1" of the adhesive film ACF and resistances R2 and R2' of the detection pad DP may be applied to the test current I.

The conversion circuit shown in FIG. 11 can be obtained by performing a Y–Δ transformation on the equivalent circuit of FIG. 10, calculating a parallel resistance, and then performing a Δ–Y transformation.

Referring to FIG. 11, a first resistance R11 may be calculated by converting the resistances R1, R1', and R1" of the adhesive film ACF, and a second resistance R22 may be calculated by converting the resistances R2 and R2' of the detection pad DP. In addition, since a voltage applied to point A becomes the same second voltage V2 applied to point B, the potential difference between point A and point B may be zero. Accordingly, the test current I may flow to the first contact point CTP1, without flowing to the variable portion VP. Therefore, the resistance detected between the first voltage V1 and the second voltage V2 may have the same value as the resistance of the adhesive film ACF. In other words, since only the resistance of the adhesive film ACF can be measured, a resistance noise can be reduced. Accordingly, the connection resistance of the integrated circuit IC may be accurately measured regardless of the degree to which the circuit detection pad DP_IC is aligned in the first direction D1.

Figure 12:
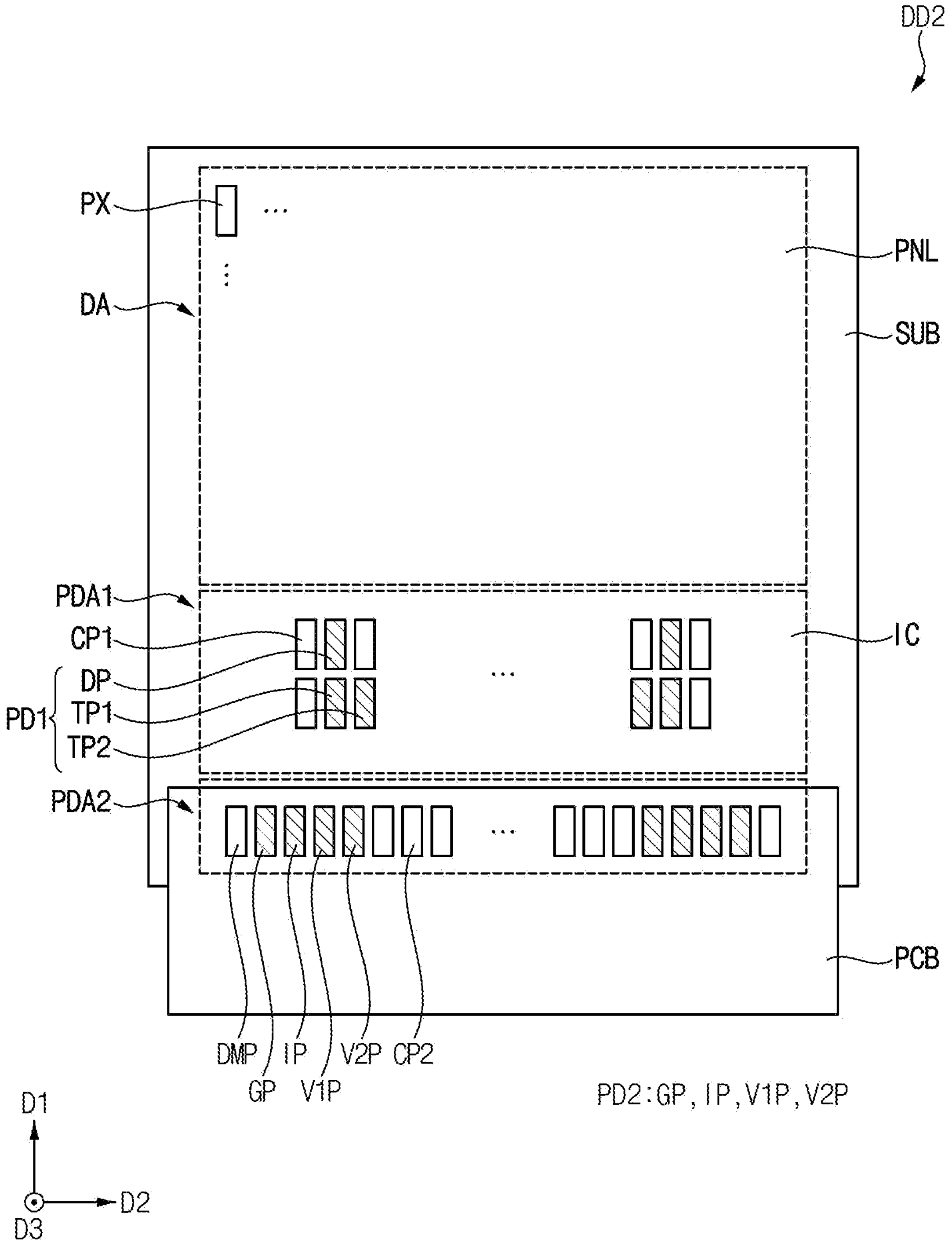
FIG. 12 is a plan view illustrating a display device according to another embodiment of the inventive concept.
Figure 13:
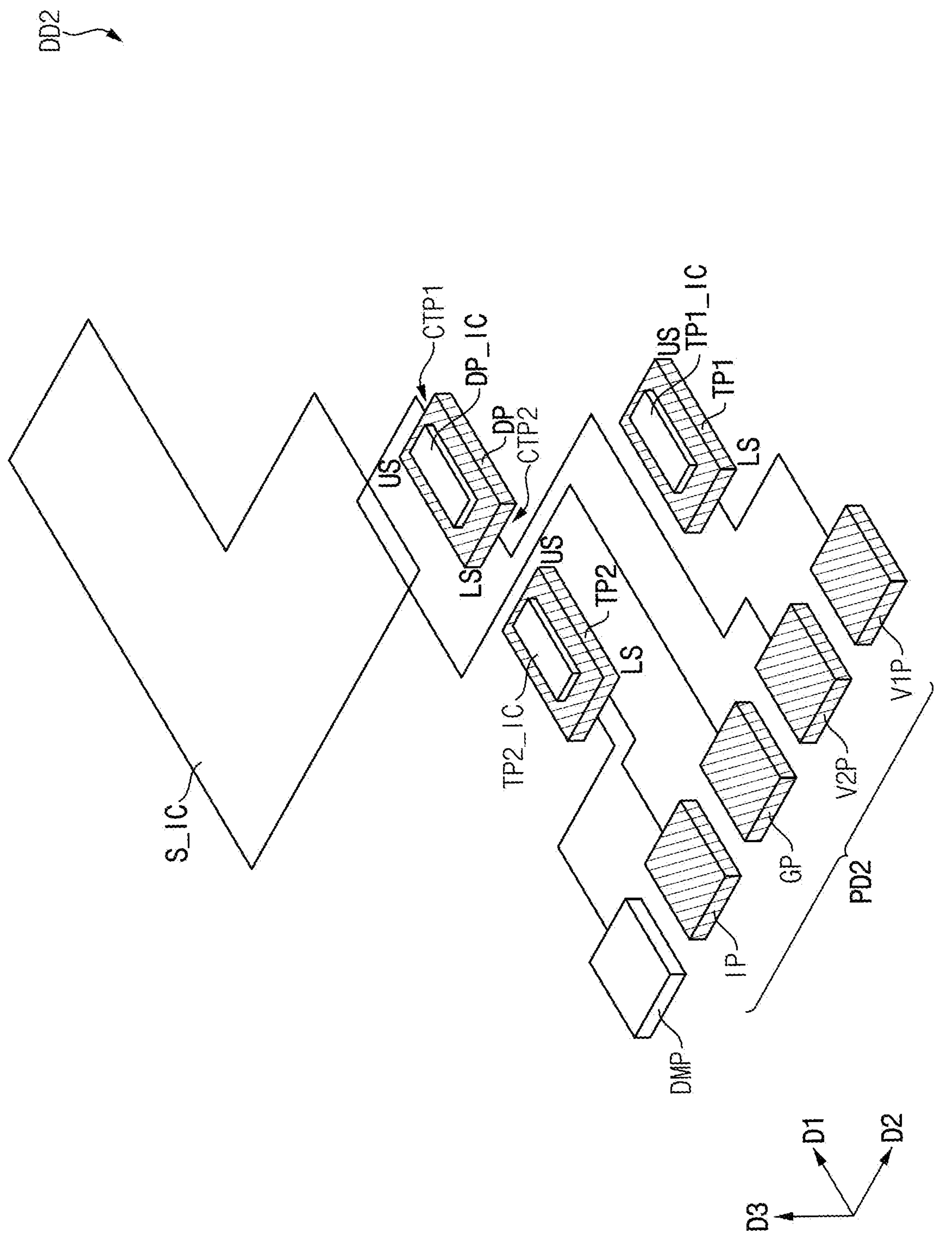
FIG. 13 is a perspective view illustrating first pads and second pads included in the display device of FIG. 12.
Figure 14:
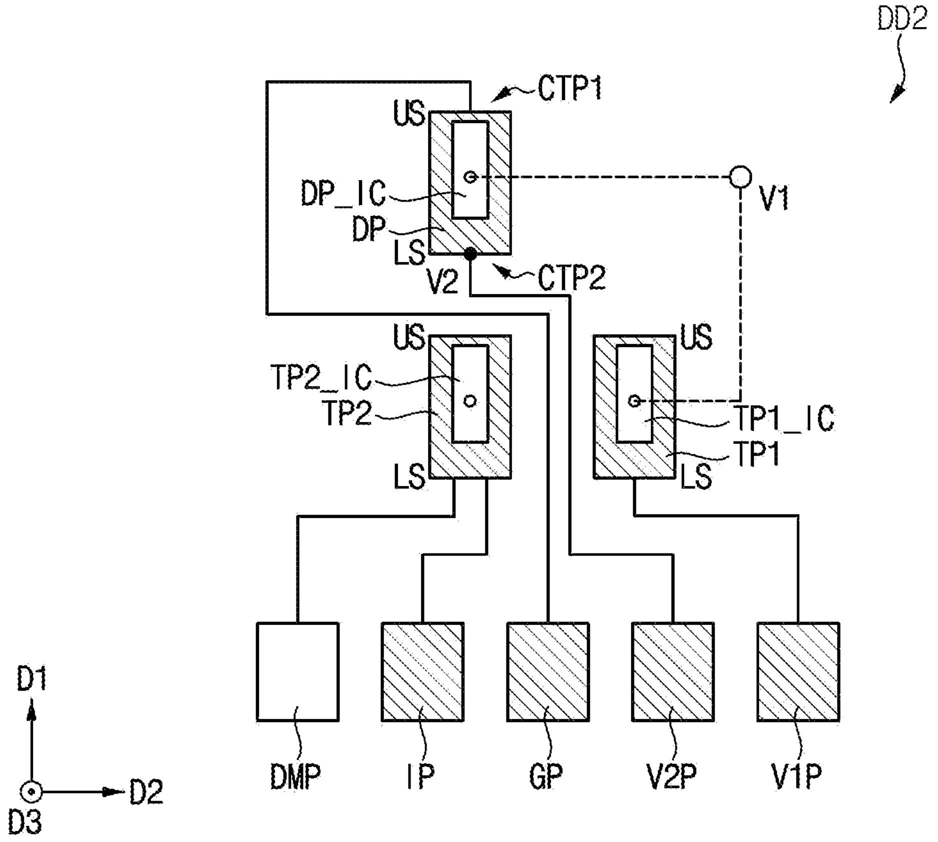
FIG. 14 is a plan view illustrating the first pads and the second pads of FIG. 13.

FIG. 12 is a plan view illustrating a display device according to another embodiment of the inventive concept. FIG. 13 is a perspective view illustrating first pads and second pads included in the display device of FIG. 12. FIG. 14 is a plan view illustrating the first pads and the second pads of FIG. 13.

Referring to FIG. 12, a display device DD2 according to another embodiment of the inventive concept may be divided into a display area DA, a first pad area PDA1, and a second pad area PDA2.

However, the display device DD2 may be substantially the same as the display device DD1 described with reference to FIG. 1, except for pads disposed in the first pad area PDA1 and the second pad area PDA2. For example, the layout of the pads disposed in the first pad area PDA1 and the second pad area PDA2 is different from that shown in FIG. 1.

Referring to FIGS. 13 and 14, the first test pad TP1 may be adjacent to the second test pad TP2 in a second direction D2 perpendicular to the first direction D1. The detection pad DP may be adjacent to the second test pad TP2 in the first direction D1.

In an embodiment, the first voltage pad V1P may be electrically connected to the first test pad TP1. The first voltage pad V1P may apply a first voltage V1 to the first test pad TP1.

For example, the first test pad TP1 may include an upper surface US facing the detection pad DP and a lower surface LS opposite to the upper surface US, and the first voltage pad V1P may be electrically connected to the first test pad TP1 on the lower surface LS of the first test pad TP1.

In an embodiment, the current pad IP may be electrically connected to the second test pad TP2. The current pad IP may provide the test current I to the second test pad TP2.

For example, the second test pad TP2 may include an upper surface US facing the detection pad DP and a lower surface LS opposite to the upper surface US, and the current pad IP may be electrically connected to the second test pad TP2 on the lower surface LS of the second test pad TP2.

In an embodiment, the second voltage pad V2P may be electrically connected to the detection pad DP. The second voltage pad V2P may apply a second voltage V2 to the detection pad DP.

In addition, in an embodiment, the ground pad GP may be electrically connected to the detection pad DP. The ground pad GP may apply a ground voltage G to the detection pad DP.

For example, the detection pad DP may include a lower surface LS facing the first test pad TP1 and an upper surface US opposite to the lower surface LS.

In an embodiment, the ground pad GP may be electrically connected to the detection pad DP through a first contact point CTP1 of the detection pad DP, and the second voltage pad V2P may be electrically connected to the detection pad DP through a second contact point CTP2 of the detection pad DP. In this case, the first contact point CTP1 may be opposite to the second contact point CTP2 in the first direction D1. For example, the first contact point CTP1 may be provided on the upper surface US of the detection pad DP, and the second contact point CTP2 may be provided on the lower surface LS of the detection pad DP.

In an embodiment, the display device DD2 may further include a dummy pad DMP. The dummy pad DMP may be disposed in the second pad area PDA2. For example, as shown in FIGS. 13 and 14, the dummy pad DMP may be adjacent to the current pad IP and may be electrically connected to the second test pad TP2. For example, the dummy pad DMP may be connected to the lower surface LS of the second test pad TP2. When the connection between the current pad IP and the second test pad TP2 is poor, the dummy pad DMP may provide the test current I to the second test pad TP2.

Figure 15:
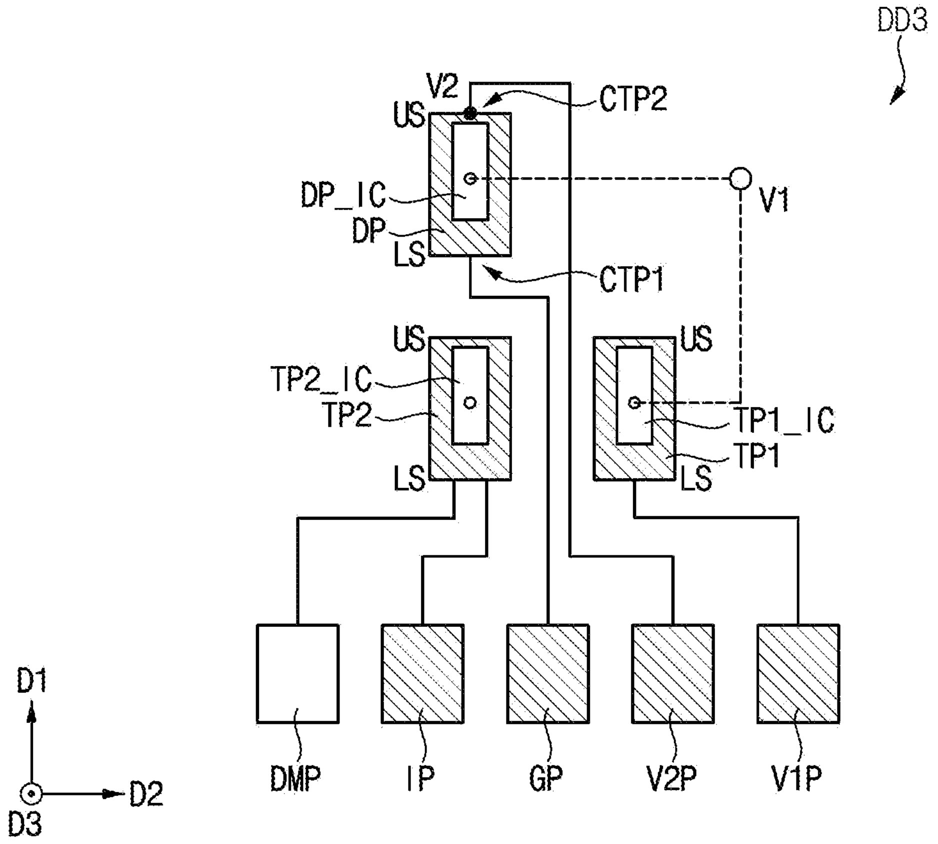
FIG. 15 is a plan view illustrating a display device according to still another embodiment of the inventive concept.

FIG. 15 is a plan view illustrating a display device according to still another embodiment of the inventive concept.

Referring to FIG. 15, a display device DD3 according to still another embodiment of the inventive concept may be substantially the same as the display device DD2 described with reference to FIGS. 12 to 14, except for contact point where the ground pad GP and the second voltage pad V2P are connected to the detection pad DP.

In an embodiment, the ground pad GP may be electrically connected to the detection pad DP through a first contact point CTP1 of the detection pad DP, and the second voltage pad V2P may be electrically connected to the detection pad DP through a second contact point CTP2 of the detection pad DP. In this case, the first contact point CTP1 may be opposite to the second contact point CTP2 in the first direction D1. For example, the first contact point CTP1 may be provided on the lower surface LS of the detection pad DP, and the second contact point CTP2 may be provided on the upper surface US of the detection pad DP.

Figure 16:
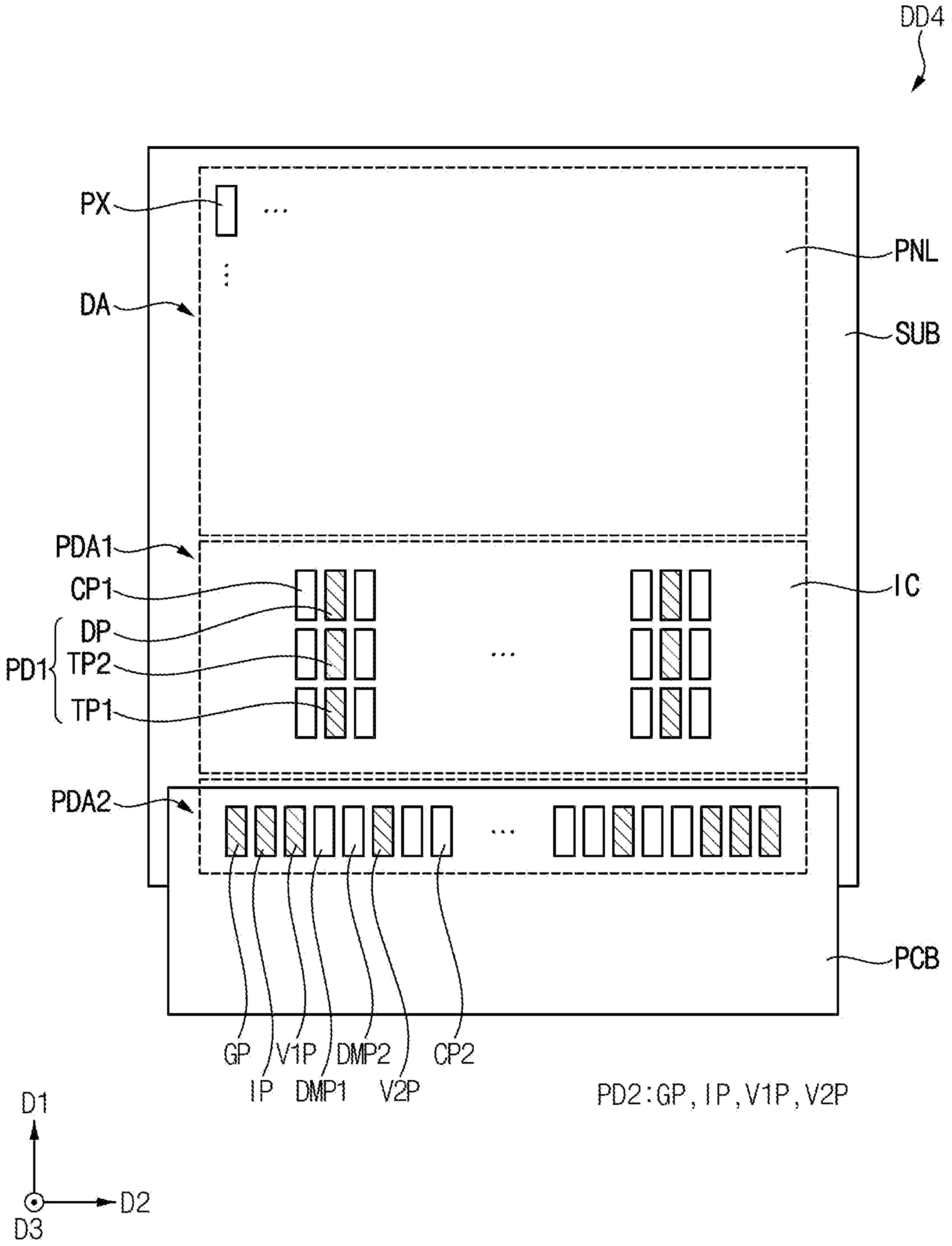
FIG. 16 is a plan view illustrating a display device according to still another embodiment of the inventive concept.
Figure 17:
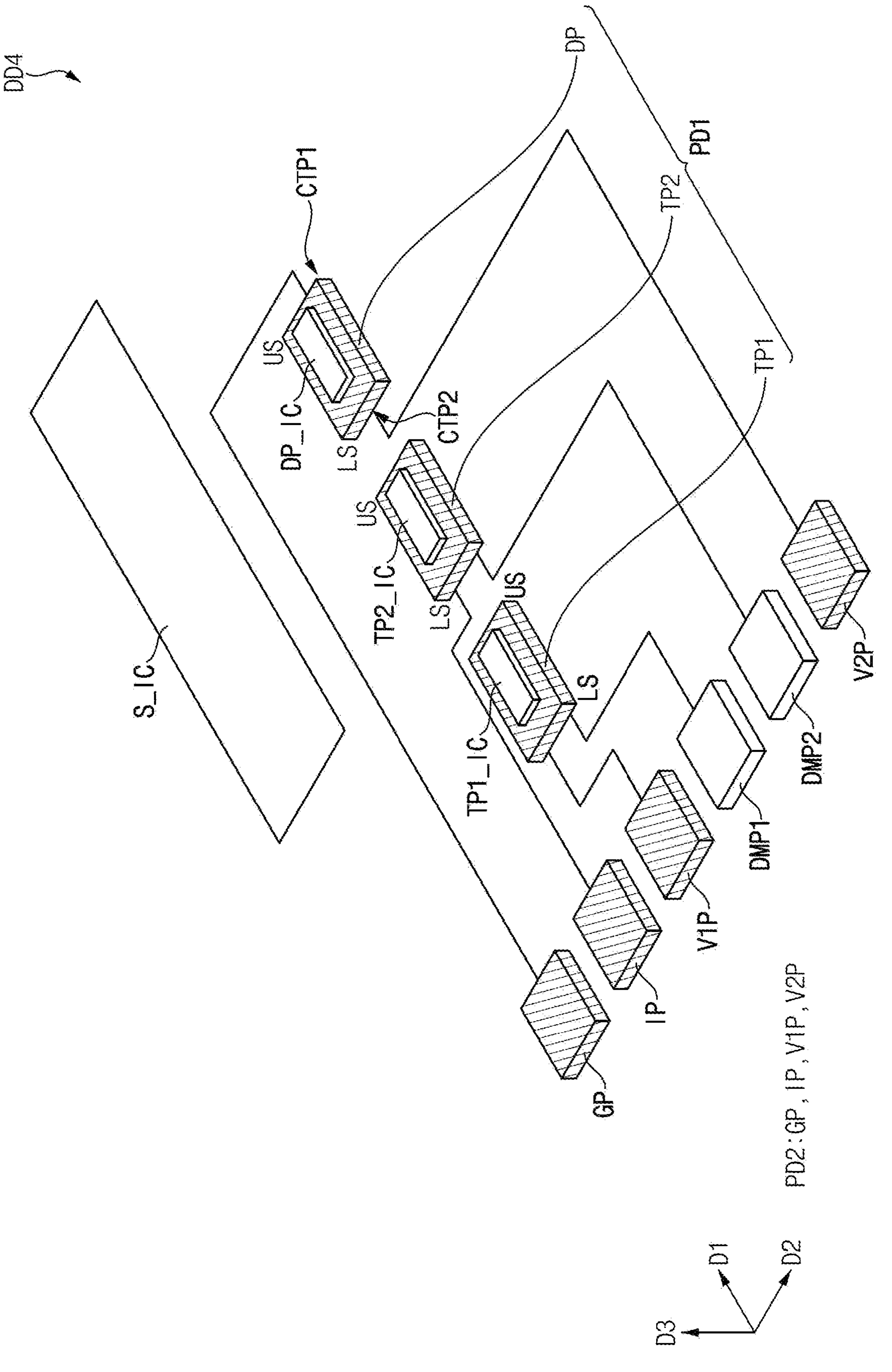
FIG. 17 is a perspective view illustrating first pads and second pads included in the display device of FIG. 16.
Figure 18:
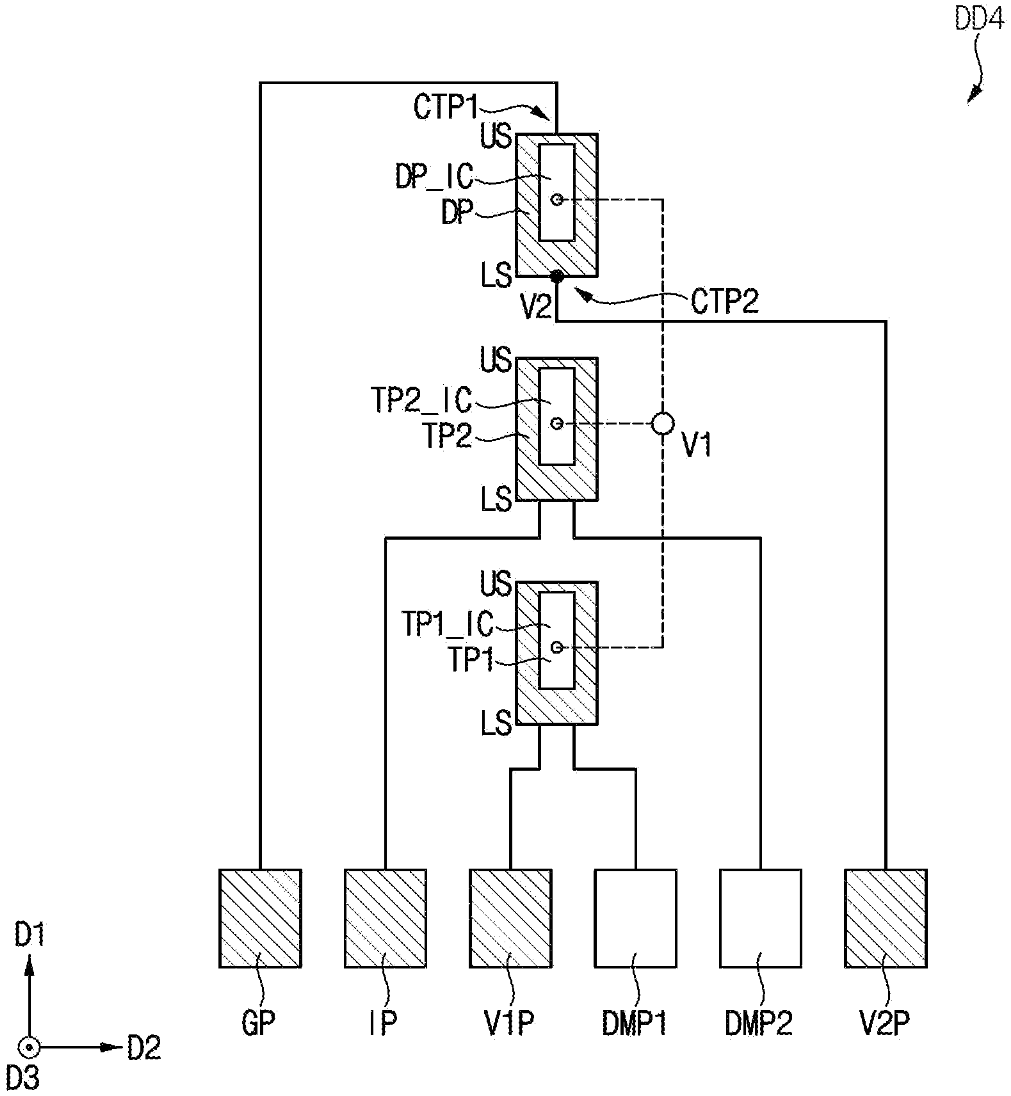
FIG. 18 is a plan view illustrating the first pads and the second pads of FIG. 17.

FIG. 16 is a plan view illustrating a display device according to still another embodiment of the inventive concept. FIG. 17 is a perspective view illustrating first pads and second pads included in the display device of FIG. 16. FIG. 18 is a plan view illustrating the first pads and the second pads of FIG. 17.

Referring to FIG. 16, a display device DD4 according to still another embodiment of the inventive concept may be divided into a display area DA, a first pad area PDA1, and a second pad area PDA2.

However, the display device DD4 may be substantially the same as the display device DD1 described with reference to FIG. 1 except for pads disposed in the second pad area PDA2.

Referring to FIGS. 17 and 18, the display device DD4 may further include a first dummy pad DMP1 and a second dummy pad DMP2. The first and second dummy pads DMP1 and DMP2 may be disposed in the second pad area PDA2. For example, as shown in FIGS. 17 and 18, the first and second dummy pads DMP1 and DMP2 may be disposed between the first voltage pad V1P and the second voltage pad V2P. The first dummy pad DMP1 may be electrically connected to the first test pad TP1, and the second dummy pad DMP2 may be electrically connected to the second test pad TP2. When the connection between the first voltage pad V1P and the first test pad TP1 is poor, the first dummy pad DMP1 may apply the first voltage V1 to the first test pad TP2. When the connection between the current pad IP and the second test pad TP2 is poor, the second dummy pad DMP2 may provide the test current I to the second test pad TP2.

In addition, as described above with reference to FIGS. 6 and 7, in an embodiment, the ground pad GP may be electrically connected to the detection pad DP through a first contact point CTP1 of the detection pad DP, and the second voltage pad V2P may be electrically connected to the detection pad DP through a second contact point CTP2 of the detection pad DP. In this case, the first contact point CTP1 may be opposite to the second contact point CTP2 in the first direction D1. For example, the first contact point CTP1 may be provided on the upper surface US of the detection pad DP, and the second contact point CTP2 may be provided on the lower surface LS of the detection pad DP.

Figure 19:
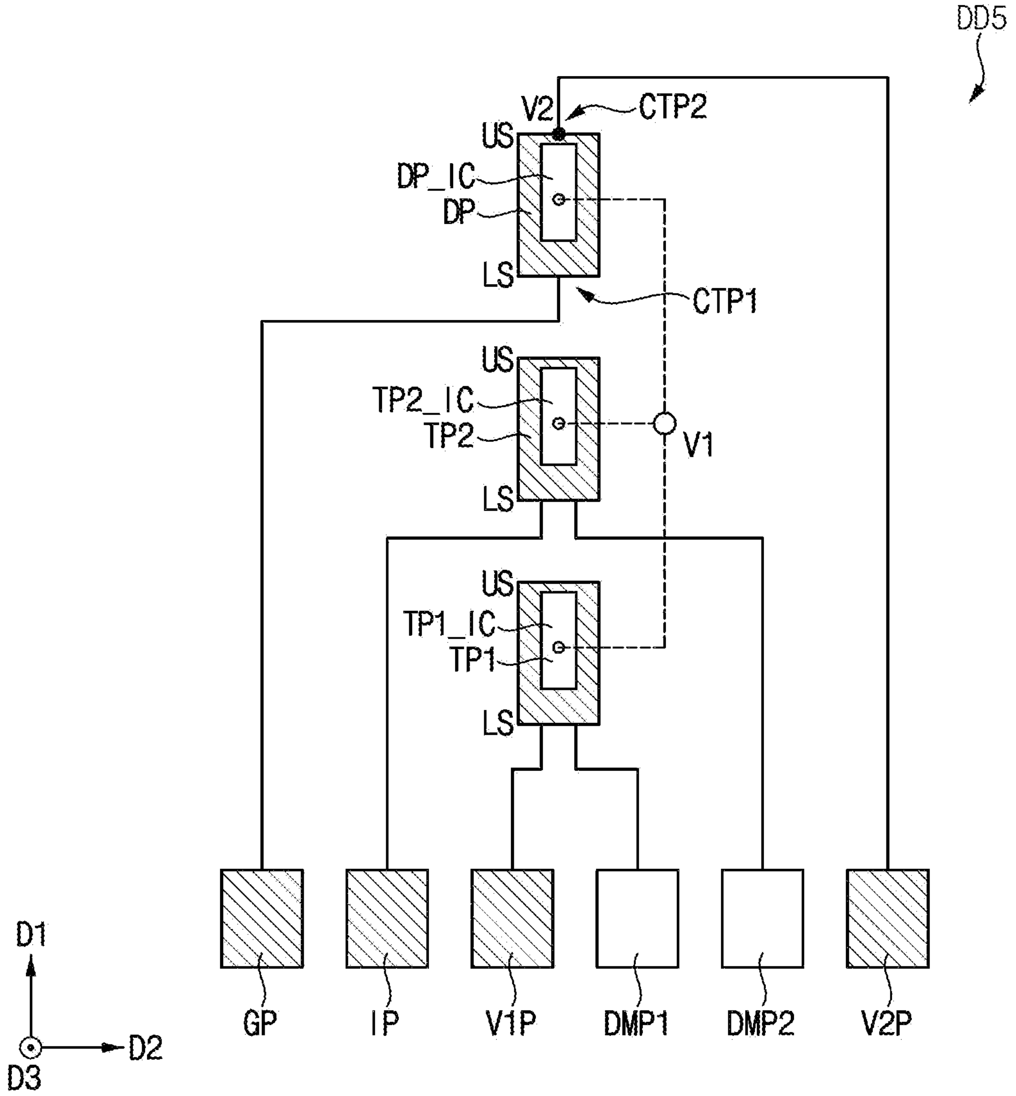
FIG. 19 is a plan view illustrating a display device according to still another embodiment of the inventive concept.

FIG. 19 is a plan view illustrating a display device according to still another embodiment of the inventive concept.

Referring to FIG. 19, a display device DD5 according to still another embodiment of the inventive concept may be substantially the same as the display device DD4 described with reference to FIGS. 16 to 18, except for contact point where the ground pad GP and the second voltage pad V2P are connected to the detection pad DP.

In an embodiment, the ground pad GP may be electrically connected to the detection pad DP through a first contact point CTP1 of the detection pad DP, and the second voltage pad V2P may be electrically connected to the detection pad DP through a second contact point CTP2 of the detection pad DP. In this case, the first contact point CTP1 may be opposite to the second contact point CTP2 in the first direction D1. For example, the first contact point CTP1 may be provided on the lower surface LS of the detection pad DP, and the second contact point CTP2 may be provided on the upper surface US of the detection pad DP.

Figure 20:
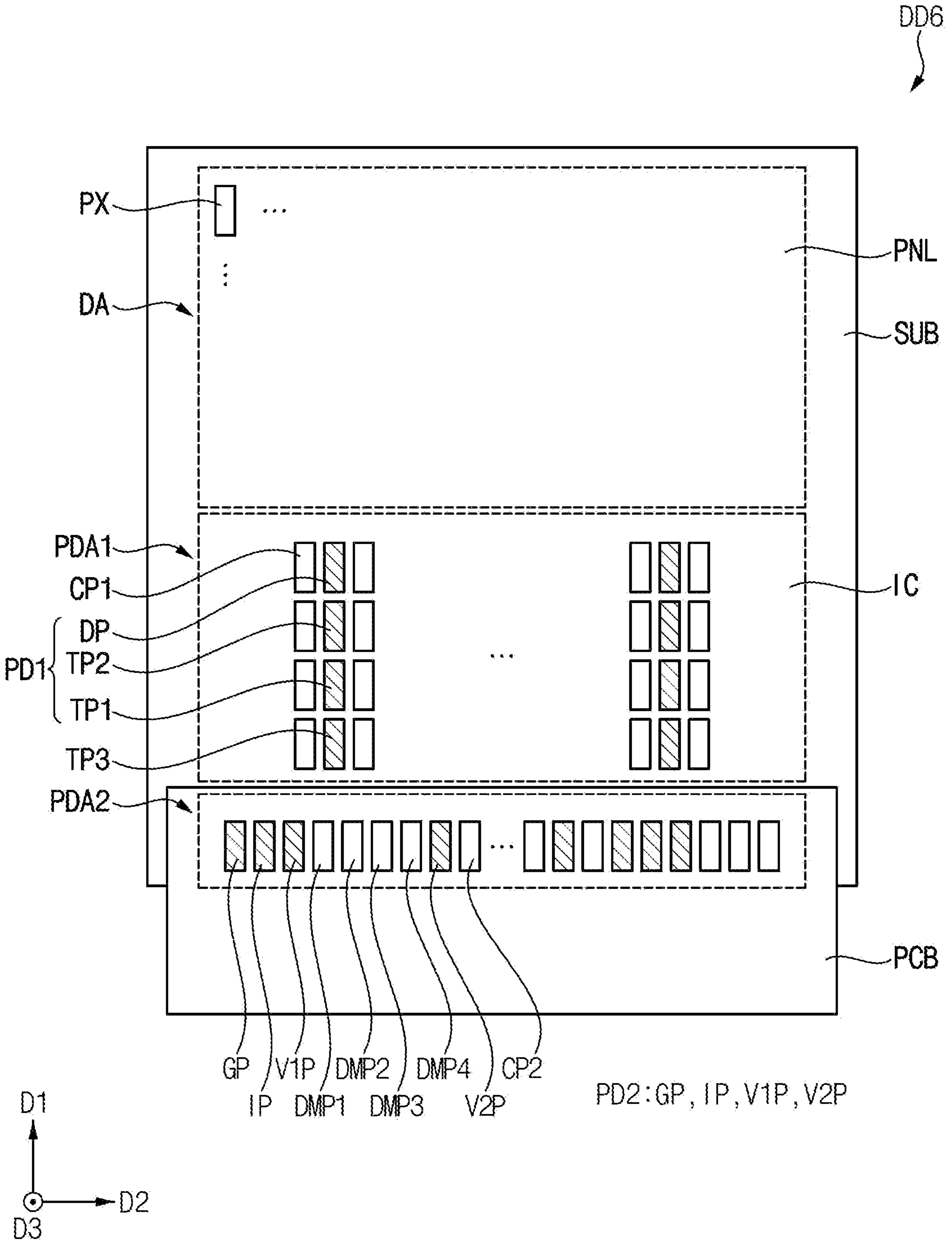
FIG. 20 is a plan view illustrating a display device according to still another embodiment of the inventive concept.
Figure 21:
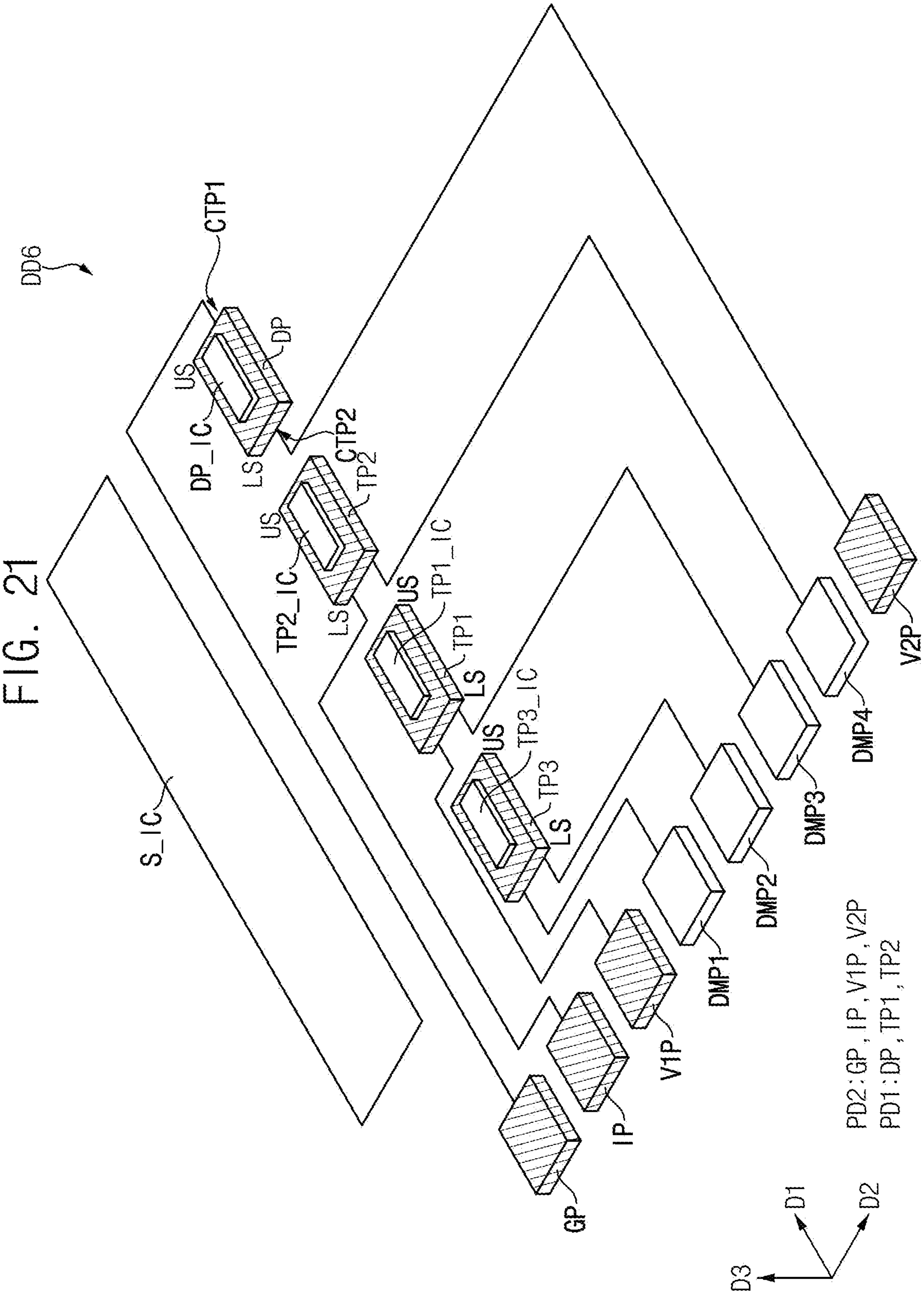
FIG. 21 is a perspective view illustrating first pads and second pads included in the display device of FIG. 20.
Figure 22:
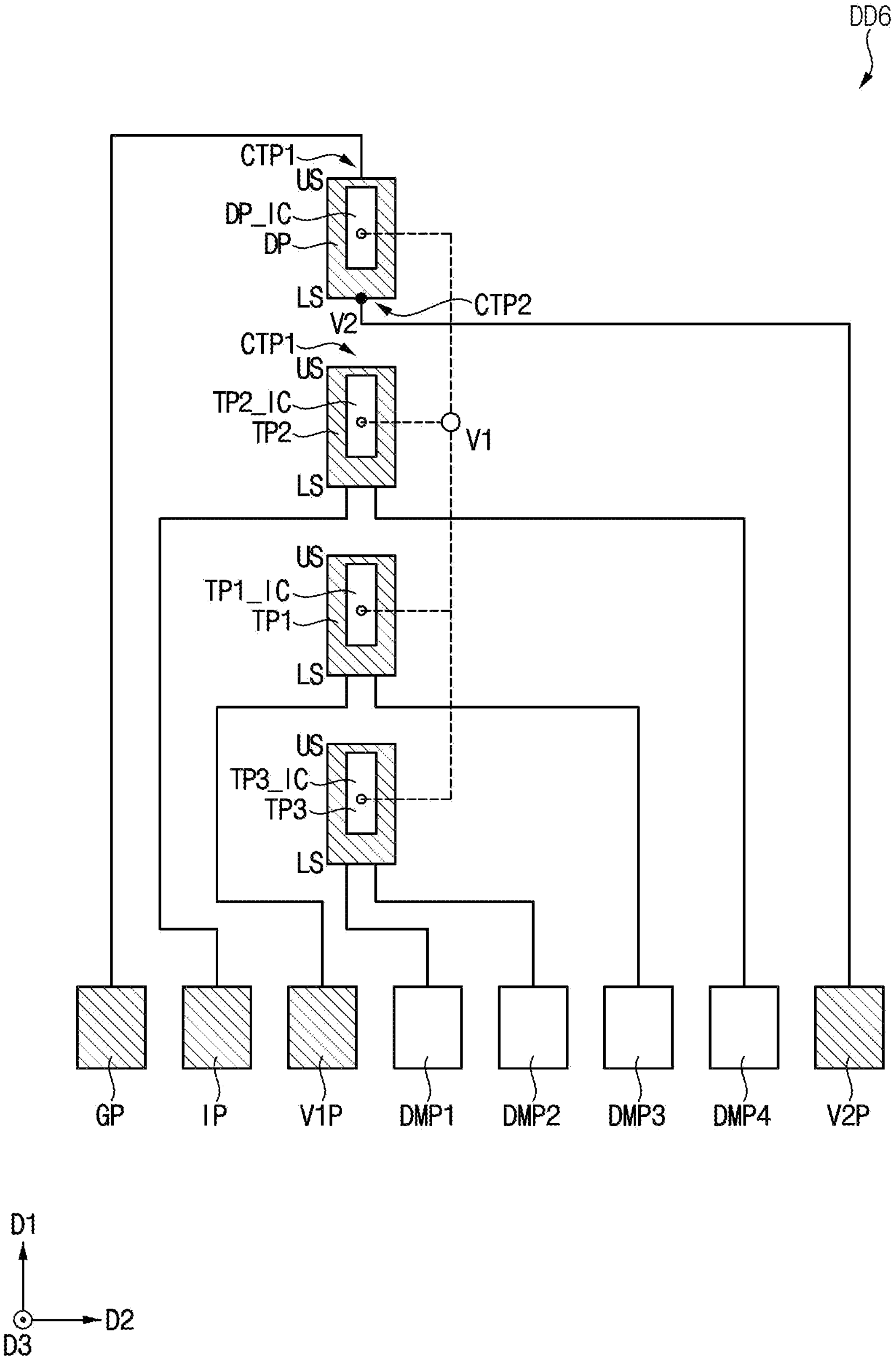
FIG. 22 is a plan view illustrating the first pads and the second pads of FIG. 21.

FIG. 20 is a plan view illustrating a display device according to still another embodiment of the inventive concept. FIG. 21 is a perspective view illustrating first pads and second pads included in the display device of FIG. 20. FIG. 22 is a plan view illustrating the first pads and the second pads of FIG. 21.

Referring to FIG. 20, a display device DD6 according to still another embodiment of the inventive concept may be divided into a display area DA, a first pad area PDA1, and a second pad area PDA2.

However, the display device DD6 may be substantially the same as the display device DD1 described with reference to FIG. 1 except for pads disposed in the first pad area PDA1 and the second pad area PDA2.

Referring to FIGS. 21 and 22, the second test pad TP2 may be disposed between the detection pad DP and the first test pad TP1. A third test pad TP3 may be adjacent to the first test pad TP1 in the second direction D2. In this case, the third test pad TP3, the first test pad TP1 and the second test pad TP2 may be arranged in sequence in a line in the first direction D1.

In an embodiment, the ground pad GP may be electrically connected to the detection pad DP through a first contact point CTP1 of the detection pad DP, and the second voltage pad V2P may be connected to the detection pad DP through a second contact point CTP2 of the detection pad DP. In this case, the first contact point CTP1 may be opposite to the second contact point CTP2 in the first direction D1. For example, the first contact point CTP1 may be provided on the upper surface US of the detection pad DP, and the second contact point CTP2 may be provided on the lower surface LS of the detection pad DP.

In an embodiment, the display device DD6 may further include first, second, third and fourth dummy pads DMP1, DMP2, DMP3, and DMP4. The first to fourth dummy pads DMP1, DMP2, DMP3, and DMP4 may be disposed in the second pad area PDA2. For example, as shown in FIGS. 21 and 22, the first to fourth dummy pads DMP1, DMP2, DMP3, and DMP4 may be disposed between the first voltage pad V1P and the second voltage pad V2P. The first and second dummy pads DMP1 and DMP2 may be electrically connected to the third test pad TP3, the third dummy pad DMP3 may be electrically connected to the first test pad TP1, and the fourth dummy pad DMP4 may be electrically connected to the second test pad TP2.

Figure 23:
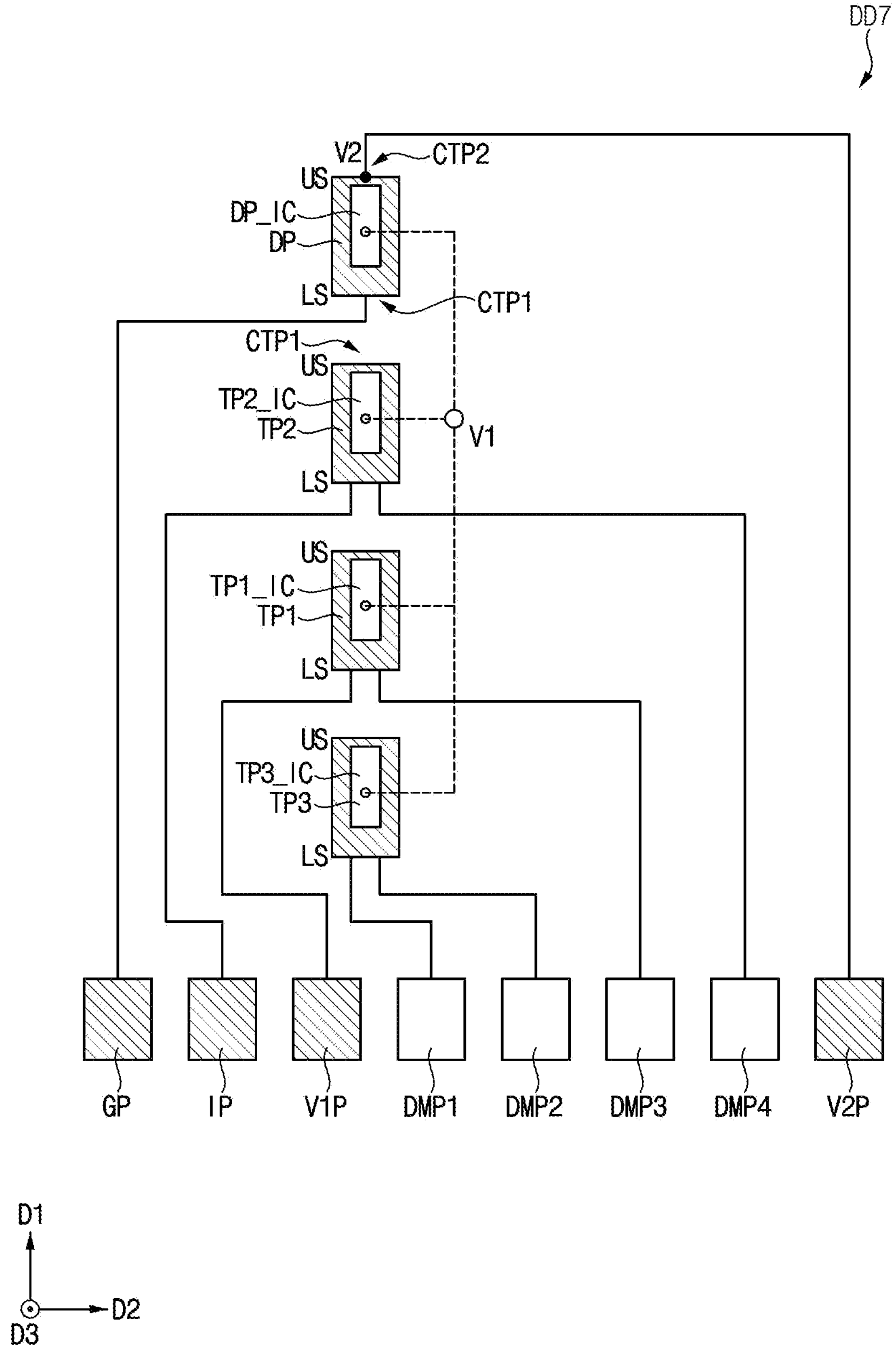
FIG. 23 is a plan view illustrating a display device according to still another embodiment of the inventive concept.

FIG. 23 is a plan view illustrating a display device according to still another embodiment of the inventive concept.

Referring to FIG. 23, a display device DD7 according to still another embodiment of the inventive concept may be substantially the same as the display device DD6 described with reference to FIGS. 20 to 22, except for contact point where the ground pad GP and the second voltage pad V2P are connected to the detection pad DP.

In an embodiment, the ground pad GP may be electrically connected to the detection pad DP through a first contact point CTP1 of the detection pad DP, and the second voltage pad V2P may be electrically connected to the detection pad DP through a second contact point CTP2 of the detection pad DP. In this case, the first contact point CTP1 may be opposite to the second contact point CTP2 in the first direction D1. For example, the first contact point CTP1 may be provided on the lower surface LS of the detection pad DP, and the second contact point CTP2 may be provided on the upper surface US of the detection pad DP.

Although certain embodiments of the inventive concept been described herein, other embodiments and modifications will be apparent to those of ordinary skill in the art.

What is claimed is:

1. A display device comprising:
- a first test pad disposed on a substrate;
- a detection pad disposed on the substrate;
- a first voltage pad disposed on the substrate and electrically connected to the first test pad;
- a ground pad disposed on the substrate and electrically connected to the detection pad through a first contact point of the detection pad; and
- a second voltage pad disposed on the substrate and electrically connected to the detection pad through a second contact point of the detection pad, wherein the second contact point is opposite to the first contact point in a first direction.

2. The display device of claim 1, wherein the detection pad includes a first surface facing the first test pad and a second surface opposite to the first surface in the first direction, the first contact point is at the second surface; and the second contact point is at the first surface.

3. The display device of claim 2, further comprising:

a second test pad disposed between the first test pad and the detection pad; and a current pad electrically connected to the second test pad.

4. The display device of claim 3, wherein the first test pad includes a second surface facing the second test pad and a first surface opposite to the second surface, and the first voltage pad is electrically connected to the first test pad at the first surface of the first test pad.

5. The display device of claim 3, wherein the second test pad includes a second surface facing the detection pad and a first surface opposite to the second surface, and the current pad is electrically connected to the second test pad at the first surface of the second test pad.

6. The display device of claim 1, further comprising:

a dummy pad electrically connected to the first test pad.

7. The display device of claim 1, further comprising:

an integrated circuit disposed on the first test pad and the detection pad; and an adhesive film adhering the integrated circuit to the substrate.

8. The display device of claim 7, wherein the integrated circuit is arranged in a chip-on-plastic (COP) method or a chip-on-glass (COG) method.

9. The display device of claim 7, wherein the adhesive film includes conductive balls, and the conductive balls electrically connect the first test pad to the integrated circuit and the detection pad to the integrated circuit.

10. The display device of claim 1, further comprising:

a printed circuit board disposed on the first voltage pad, the ground pad, and the second voltage pad.

11. The display device of claim 1, wherein the detection pad includes a first surface facing the first test pad and a second surface opposite to the first surface in the first direction, the first contact point is at the first surface, and the second contact point is at the second surface.

12. The display device of claim 11, further comprising:

a second test pad disposed between the first test pad and the detection pad, and a current pad electrically connected to the second test pad.

13. The display device of claim 11, further comprising:

a first dummy pad electrically connected to the first test pad; and a second dummy pad electrically connected to the second test pad.

14. The display device of claim 1, further comprising:

a second test pad adjacent to a second direction perpendicular to the first direction; and a current pad electrically connected to the second test pad.

15. The display device of claim 14, wherein the detection pad includes a first surface facing the first test pad and a second surface opposite to the first surface in the first direction, the first contact point is at the second surface, and the second contact point is at the first surface.

16. The display device of claim 14, wherein the detection pad includes a first surface facing the first test pad and a second surface opposite to the first surface in the first direction, the first contact point is at the first surface, and the second contact point is at the second surface.

17. The display device of claim 1, further comprising:

a second test pad disposed between the first test pad and the detection pad;

a third test pad adjacent to the first test pad; and a dummy pad electrically connected to the third test pad.

18. The display device of claim 17, wherein the detection pad includes a first surface facing the first test pad and a second surface opposite to the first surface in the first direction, the first contact point is at the second surface, and the second contact point is at the first surface.

19. The display device of claim 17, wherein the detection pad includes a first surface facing the first test pad and a second surface opposite to the first surface in the first direction, the first contact point is at the first surface, and the second contact point is at the second surface.

20. A display device comprising:

a first pad area including a first test pad, a second test pad and a detection pad arranged in a line in a first direction; and a second pad area adjacent to the first pad area, the second pad area including a ground pad, a current pad, a first voltage pad and a second voltage pad arranged in a line in a second direction intersecting the first direction, wherein the current pad is connected to the second test pad, the first voltage pad is connected to the first test pad, the ground pad is connected to a first connection point of the detection pad and the second voltage pad is connected to a second connection point of the detection pad.

* * * * *